(12) United States Patent
Chang et al.

(10) Patent No.: US 7,960,795 B2
(45) Date of Patent: Jun. 14, 2011

(54) PARTIALLY AND FULLY SILICIDED GATE STACKS

(75) Inventors: Leland Chang, New York, NY (US); Renee Tong Mo, Briarcliff Manor, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/782,388

(22) Filed: May 18, 2010

(65) Prior Publication Data

US 2010/0224940 A1    Sep. 9, 2010

Related U.S. Application Data

(62) Division of application No. 11/873,219, filed on Oct. 16, 2007, now Pat. No. 7,785,952.

(51) Int. Cl.
*H01L 21/70* (2006.01)
*H01L 21/311* (2006.01)

(52) U.S. Cl. .................................. 257/369; 438/692

(58) Field of Classification Search .................. 257/369; 438/692
See application file for complete search history.

(56) References Cited

U.S. PATENT DOCUMENTS

| | | |
|---|---|---|
| 5,576,579 A | 11/1996 | Agnello et al. |
| 5,926,730 A | 7/1999 | Hu et al. |
| 6,472,266 B1 | 10/2002 | Yu et al. |
| 6,503,788 B1 | 1/2003 | Yamamoto |
| 6,518,107 B2 | 2/2003 | Buynoski et al. |
| 6,573,169 B2 | 6/2003 | Noble et al. |
| 6,680,246 B2 | 1/2004 | Hu |
| 7,045,456 B2 | 5/2006 | Murto et al. |
| 7,151,023 B1 | 12/2006 | Nayfeh et al. |
| 7,157,358 B2 | 1/2007 | Hall et al. |
| 7,183,187 B2 | 2/2007 | Lu et al. |
| 7,229,871 B2 | 6/2007 | Yu et al. |
| 2005/0106788 A1 | 5/2005 | Amos et al. |
| 2005/0136605 A1 | 6/2005 | Murto et al. |
| 2005/0269635 A1 | 12/2005 | Bojarczuk et al. |
| 2007/0111421 A1 | 5/2007 | Cabral et al. |
| 2007/0228480 A1 | 10/2007 | Yen et al. |
| 2008/0044973 A1 | 2/2008 | Kalnitsky et al. |

*Primary Examiner* — Howard Weiss
*Assistant Examiner* — Steven H Rao
(74) *Attorney, Agent, or Firm* — Vazken Alexanian; Michael J. Chang, LLC

(57) ABSTRACT

Metal-oxide semiconductor (MOS) devices and techniques for the fabrication thereof are provided. In one aspect, a metal-oxide semiconductor device is provided comprising a substrate; and at least one n-channel field effect transistor (NFET) having a gate stack over the substrate. The NFET gate stack comprises an NFET gate stack metal gate layer; a first NFET gate stack silicon layer over the NFET gate stack metal gate layer; a second NFET gate stack silicon layer over a side of the first NFET gate stack silicon layer opposite the NFET gate stack metal gate layer, wherein an interface is defined between the first NFET gate stack silicon layer and the second NFET gate stack silicon layer; and an NFET gate stack silicide region that extends through the interface between the first NFET gate stack silicon layer and the second NFET gate stack silicon layer.

17 Claims, 16 Drawing Sheets

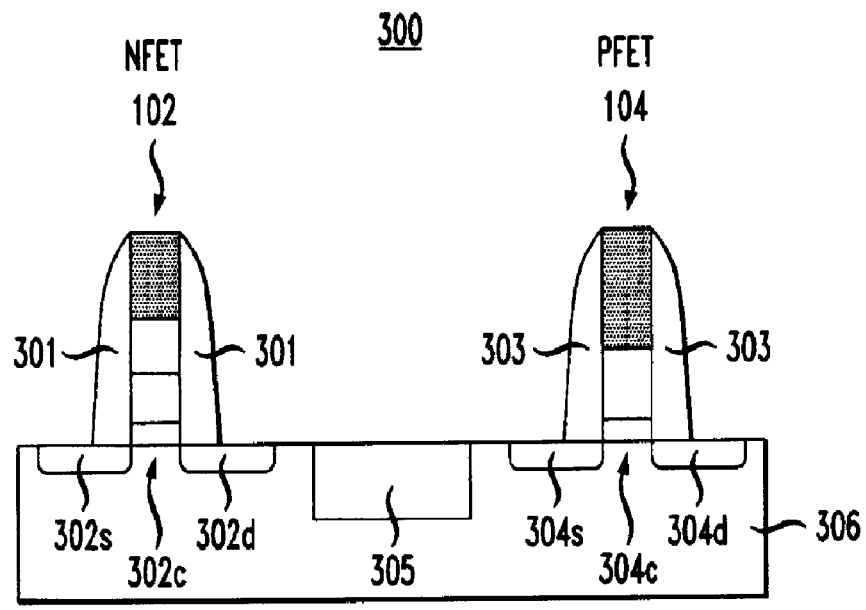
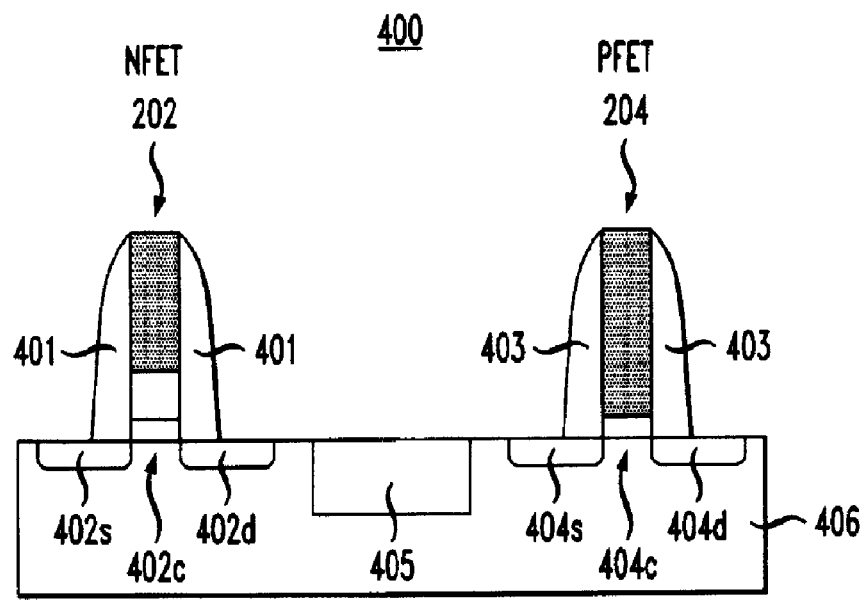

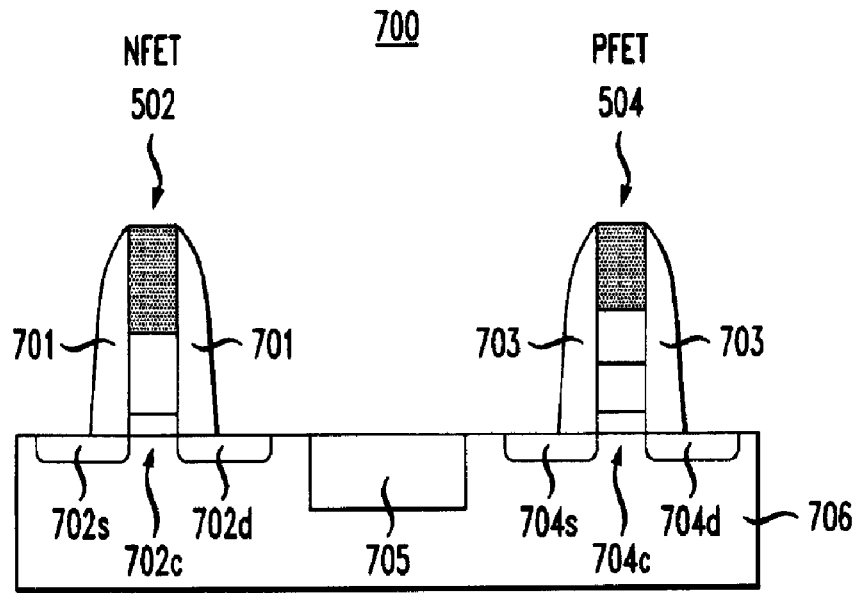
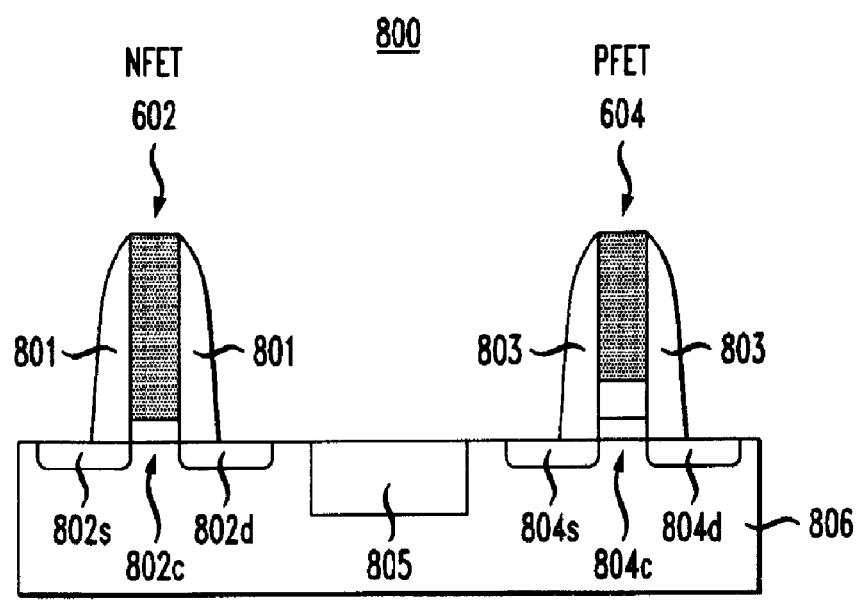

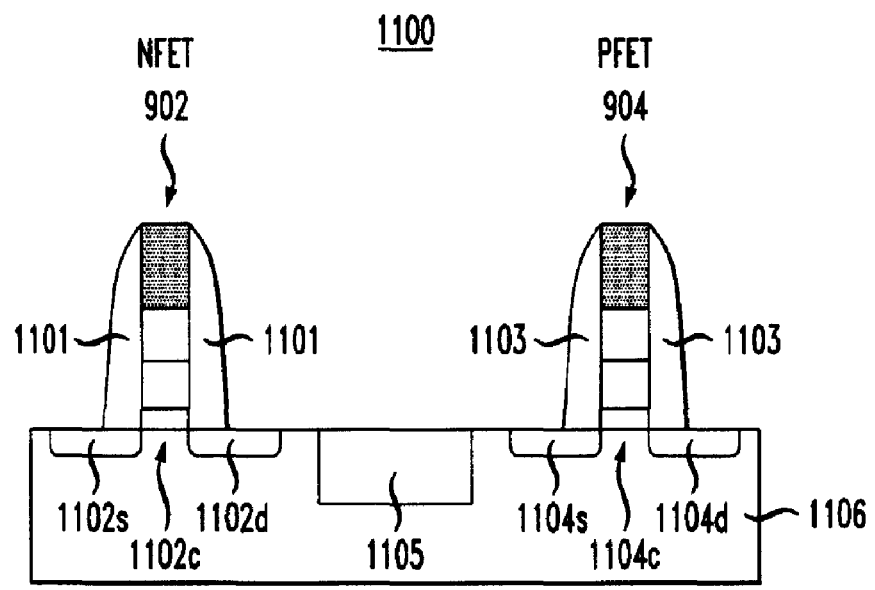
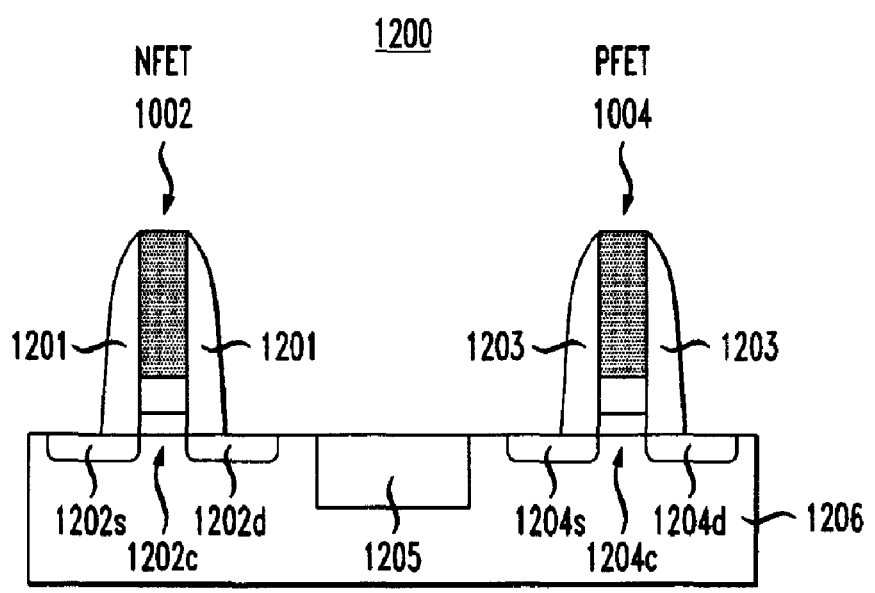

(TO FIG. 14B)

(FROM FIG. 14B)

(FROM FIG. 15B)

*FIG. 16B*
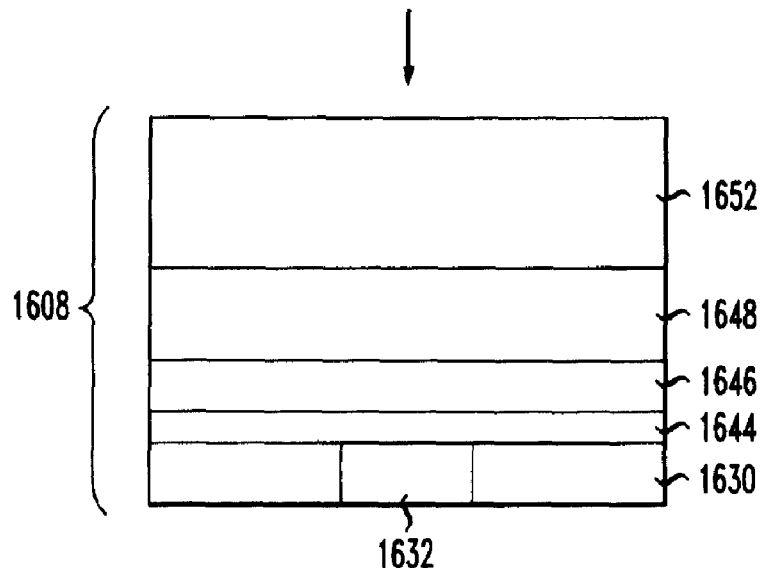
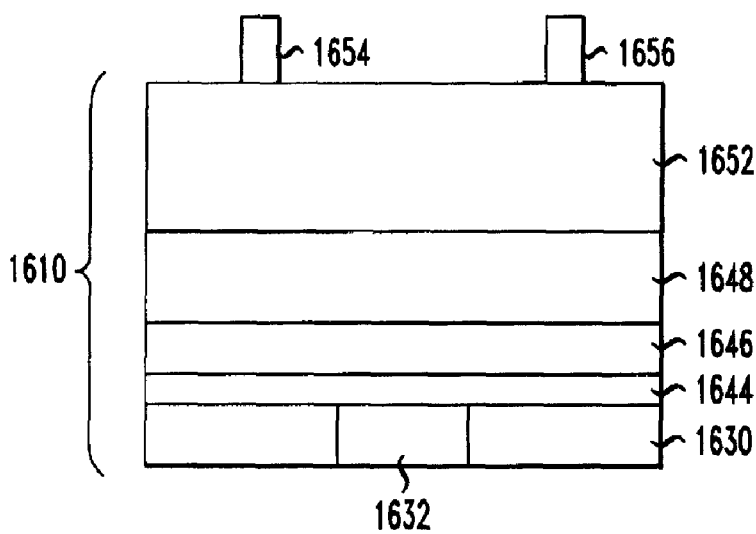

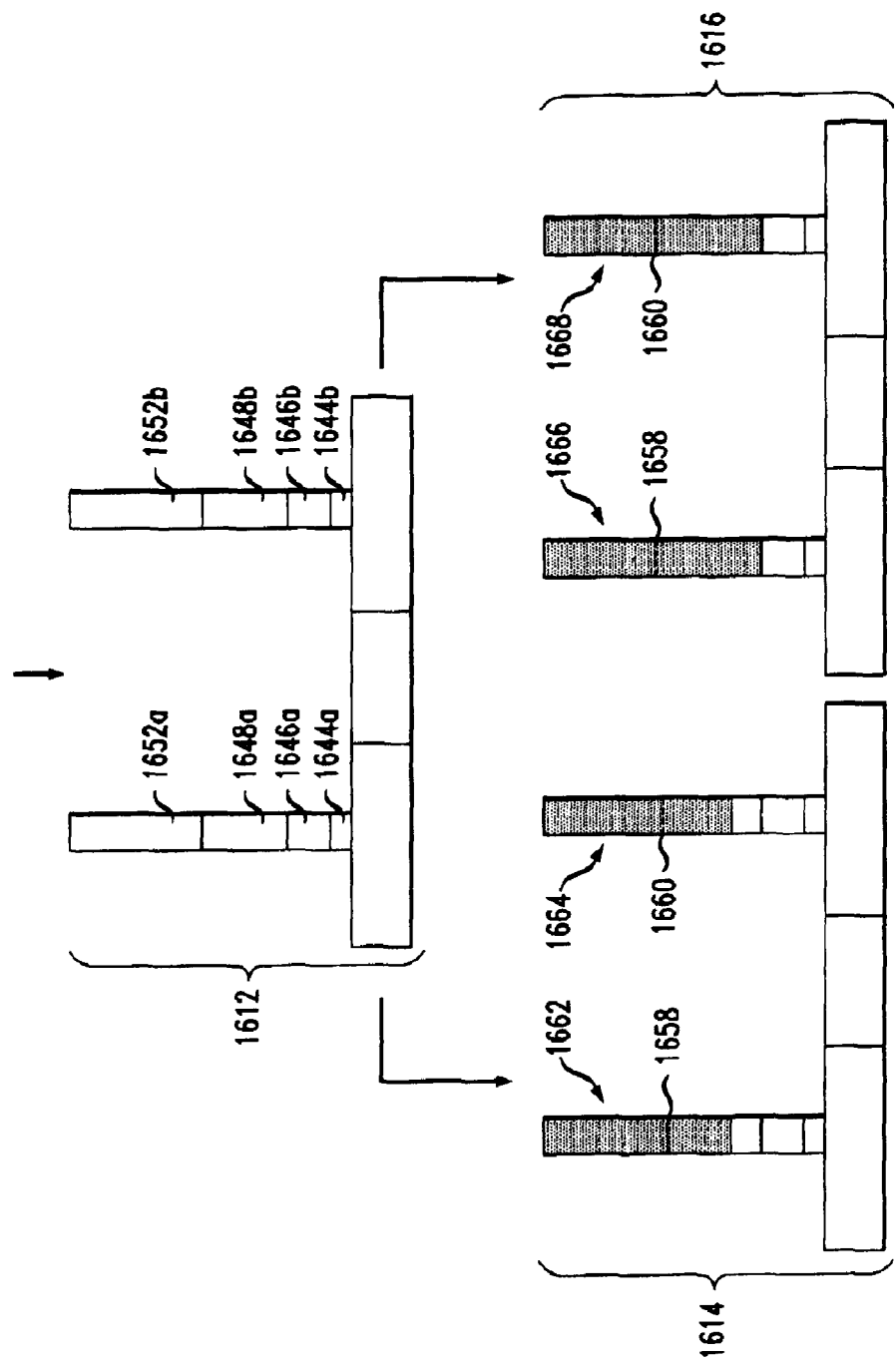

PARTIALLY AND FULLY SILICIDED GATE STACKS

CROSS-REFERENCE TO RELATED APPLICATIONS

This application is a divisional of U.S. application Ser. No. 11/873,219 filed on Oct. 16, 2007 now U.S. Pat. No. 7,785,952.

FIELD OF THE INVENTION

The present invention relates to metal-oxide semiconductor (MOS) devices, and more particularly, to MOS field-effect transistor (FET) gate stack structures and techniques for the fabrication thereof.

BACKGROUND OF THE INVENTION

Metal-oxide semiconductor (MOS) transistors are used in many integrated circuit designs, serving as switches to open and close the circuits. In general, a MOS transistor comprises a source region and a drain region connected by a channel, and a gate region separated from the channel by a gate dielectric. The channel can comprise an n-type or p-type semiconductor material, forming an n-channel MOS (NMOS) or a p-channel MOS (PMOS) transistor, respectively.

In U.S. Pat. No. 6,573,169 issued to Noble et al., entitled "Highly Conductive Composite Polysilicon Gate for CMOS Integrated Circuits," (hereinafter "Noble"), a method is disclosed for making a low-resistance gate structure for NMOS or PMOS transistors. Namely, in Noble, a polysilicon gate is formed over a gate insulation layer. A metal-substitution reaction is used to diffuse a metal into the gate. The same general process, with variations in doping, is used to form the gates for either the NMOS or PMOS transistors.

In many applications, a combination of NMOS and PMOS transistors are integrated into a common device. By way of example only, logic gate devices typically include linked NMOS/PMOS transistor pairs that act as switches between logic states. In U.S. Pat. No. 7,045,456 issued to Murto et al., entitled "MOS Transistor Gates with Thin Lower Metal Silicide and Methods for Making the Same" (hereinafter "Murto"), NMOS and PMOS transistors are used in a common complementary-metal-oxide semiconductor (CMOS) device, wherein a gate is formed for each of the NMOS and PMOS transistors by a series of reaction steps to form a fully silicided gate electrode over a gate dielectric. As with Noble, in Murto, the NMOS transistor and PMOS transistor gates are formed by the same general process, with variations in doping.

In some applications, however, it is desirable to employ NMOS transistors and PMOS transistors in a common device that have different gate structures from one another. Varying the gate structure can help to optimize the work function of each transistor type. For example, a certain gate structure can be used to optimize the work function of the NMOS transistors, while a different gate structure can be used to optimize the work function of the PMOS transistors.

Thus, techniques for integrating NMOS and PMOS transistors having different gate structures within a common device would be desirable.

SUMMARY OF THE INVENTION

The present invention provides metal-oxide semiconductor (MOS) devices and techniques for the fabrication thereof.

In one aspect of the invention, a metal-oxide semiconductor device is provided. The metal-oxide semiconductor device comprises a substrate; and at least one n-channel field effect transistor (NFET) having a gate stack over the substrate. The NFET gate stack comprises an NFET gate stack metal gate layer; a first NFET gate stack silicon layer over the NFET gate stack metal gate layer; a second NFET gate stack silicon layer over a side of the first NFET gate stack silicon layer opposite the NFET gate stack metal gate layer, wherein an interface is defined between the first NFET gate stack silicon layer and the second NFET gate stack silicon layer; and an NFET gate stack silicide region that extends through the interface between the first NFET gate stack silicon layer and the second NFET gate stack silicon layer.

The MOS device may further comprise at least one p-channel field effect transistor (PFET) having a gate stack over the substrate. The PFET gate stack comprises a first PFET gate stack silicon layer; a second PFET gate stack silicon layer over a side of the first PFET gate stack silicon layer, wherein an interface is defined between the first PFET gate stack silicon layer and the second PFET gate stack silicon layer; and a PFET gate stack silicide region that extends through the interface between the first PFET gate stack silicon layer and the second PFET gate stack silicon layer.

The MOS device may further comprise at least one PFET having a gate stack over the substrate. The PFET gate stack comprises a PFET gate stack metal gate layer; a first PFET gate stack silicon layer over the PFET gate stack metal gate layer; a second PFET gate stack silicon layer over a side of the first PFET gate stack silicon layer opposite the PFET gate stack metal gate layer, wherein an interface is defined between the first PFET gate stack silicon layer and the second PFET gate stack silicon layer; and a PFET gate stack silicide region that extends through the interface between the first PFET gate stack silicon layer and the second PFET gate stack silicon layer.

The MOS device may further comprise at least one NFET having a gate stack over the substrate. The NFET gate stack comprises a first NFET gate stack silicon layer; a second NFET gate stack silicon layer over the first NFET gate stack silicon layer, wherein an interface is defined between the first NFET gate stack silicon layer and the second NFET gate stack silicon layer; and an NFET gate stack silicide region that extends through the interface between the first NFET gate stack silicon layer and the second NFET gate stack silicon layer.

In another aspect of the invention, another metal-oxide semiconductor device is provided. The metal-oxide semiconductor device comprises a substrate; at least one NFET having a gate stack over the substrate, the NFET gate stack comprising a first NFET gate stack silicon layer; a second NFET gate stack silicon layer over the first NFET gate stack silicon layer, wherein an interface is defined between the first NFET gate stack silicon layer and the second NFET gate stack silicon layer; an NFET gate stack silicide region that extends through the interface between the first NFET gate stack silicon layer and the second NFET gate stack silicon layer; and at least one PFET having a gate stack over the substrate, the PFET gate stack comprising a PFET gate stack metal gate layer; a first PFET gate stack silicon layer over the PFET gate stack metal gate layer; a second PFET gate stack silicon layer over a side of the first PFET gate stack silicon layer opposite the PFET gate stack metal gate layer, wherein an interface is defined between the first PFET gate stack silicon layer and the second PFET gate stack silicon layer; and a PFET gate stack silicide region that extends through the interface between the first PFET gate stack silicon layer and the second PFET gate stack silicon layer.

In yet another aspect of the invention, a method of fabricating a metal-oxide semiconductor device is provided. The method comprises the following steps. A substrate is provided. A shallow trench isolation region is formed in the substrate that divides the substrate into an NFET region and a PFET region. At least one NFET gate stack is formed over the NFET region of the substrate. The NFET gate stack comprises an NFET gate stack metal gate layer; a first NFET gate stack silicon layer over the NFET gate stack metal gate layer; a second NFET gate stack silicon layer over a side of the first NFET gate stack silicon layer opposite the NFET gate stack metal gate layer, wherein an interface is defined between the first NFET gate stack silicon layer and the second NFET gate stack silicon layer. At least one PFET gate stack is formed over the PFET region of the substrate. The PFET gate stack comprises a first PFET gate stack silicon layer; a second PFET gate stack silicon layer over a side of the first PFET gate stack silicon layer, wherein an interface is defined between the first PFET gate stack silicon layer and the second PFET gate stack silicon layer. An NFET gate stack silicide region is formed that extends through the interface between the first NFET gate stack silicon layer and the second NFET gate stack silicon layer. A PFET gate stack silicide region is formed that extends through the interface between the first PFET gate stack silicon layer and the second PFET gate stack silicon layer.

In still yet another aspect of the invention, another method of fabricating a metal-oxide semiconductor device is provided. The method comprises the following steps. A substrate is provided. A shallow trench isolation region is formed in the substrate that divides the substrate into an NFET region and a PFET region. At least one NFET gate stack is formed over the NFET region of the substrate. The NFET gate stack comprises a first NFET gate stack silicon layer; a second NFET gate stack silicon layer over the first NFET gate stack silicon layer, wherein an interface is defined between the first NFET gate stack silicon layer and the second NFET gate stack silicon layer. At least one PFET gate stack is formed over the PFET region of the substrate. The PFET gate stack comprises a PFET gate stack metal gate layer; a first PFET gate stack silicon layer over the PFET gate stack metal gate layer; a second PFET gate stack silicon layer over a side of the first PFET gate stack silicon layer opposite the PFET gate stack metal gate layer, wherein an interface is defined between the first PFET gate stack silicon layer and the second PFET gate stack silicon layer. An NFET gate stack silicide region is formed that extends through the interface between the first NFET gate stack silicon layer and the second NFET gate stack silicon layer. A PFET gate stack silicide region is formed that extends through the interface between the first PFET gate stack silicon layer and the second PFET gate stack silicon layer.

In a further aspect of the invention, yet another method of fabricating a metal-oxide semiconductor device is provided. The method comprises the following steps. A substrate is provided. A shallow trench isolation region is formed in the substrate that divides the substrate into an NFET region and a PFET region. At least one NFET gate stack is formed over the NFET region of the substrate. The NFET gate stack comprises an NFET gate stack metal gate layer; a first NFET gate stack silicon layer over the NFET gate stack metal gate layer; a second NFET gate stack silicon layer over a side of the first NFET gate stack silicon layer opposite the NFET gate stack metal gate layer, wherein an interface is defined between the first NFET gate stack silicon layer and the second NFET gate stack silicon layer. At least one PFET gate stack is formed over the PFET region of the substrate. The PFET gate stack comprises a PFET gate stack metal gate layer; a first PFET gate stack silicon layer over the PFET gate stack metal gate layer; a second PFET gate stack silicon layer over a side of the first PFET gate stack silicon layer opposite the PFET gate stack metal gate layer, wherein an interface is defined between the first PFET gate stack silicon layer and the second PFET gate stack silicon layer. An NFET gate stack silicide region is formed that extends through the interface between the first NFET gate stack silicon layer and the second NFET gate stack silicon layer. A PFET gate stack silicide region is formed that extends through the interface between the first PFET gate stack silicon layer and the second PFET gate stack silicon layer.

A more complete understanding of the present invention, as well as further features and advantages of the present invention, will be obtained by reference to the following detailed description and drawings.

BRIEF DESCRIPTION OF THE DRAWINGS

FIG. 3 is a diagram illustrating an exemplary planar metal-oxide semiconductor (MOS) device including the partially silicided NFET and PFET gate stacks of FIG. 1 according to an embodiment of the present invention;

FIG. 4 is a diagram illustrating an exemplary planar MOS device including the fully silicided NFET and PFET gate stacks of FIG. 2 according to an embodiment of the present invention;

FIG. 7 is a diagram illustrating an exemplary planar MOS device including the partially silicided NFET and PFET gate stacks of FIG. 5 according to an embodiment of the present invention;

FIG. 8 is a diagram illustrating an exemplary planar MOS device including the fully silicided NFET and PFET gate stacks of FIG. 6 according to an embodiment of the present invention;

FIG. 11 is a diagram illustrating an exemplary planar MOS device including the partially silicided NFET and PFET gate stacks of FIG. 9 according to an embodiment of the present invention;

FIG. 12 is a diagram illustrating an exemplary planar MOS device including the fully silicided NFET and PFET gate stacks of FIG. 10 according to an embodiment of the present invention;

FIGS. 16A-C are diagrams illustrating an exemplary methodology for fabricating a silicided metal NFET gate stack and a silicided metal PFET gate stack on a common substrate according to an embodiment of the present invention.

DETAILED DESCRIPTION OF PREFERRED EMBODIMENTS

Figure 1:
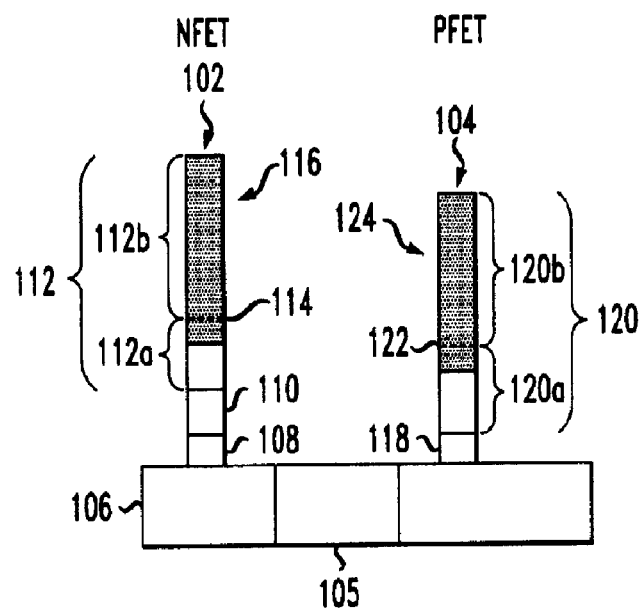
FIG. 1 is a diagram illustrating an exemplary partially silicided metal n-channel field effect transistor (NFET) gate stack integrated with an exemplary partially silicided p-channel field effect transistor (PFET) gate stack on a common substrate according to an embodiment of the present invention.

FIG. 1 is a diagram illustrating partially silicided metal n-channel metal-oxide semiconductor field effect transistor (NMOSFET) (hereinafter abbreviated as "NFET") gate stack 102 integrated with partially silicided p-channel metal-oxide semiconductor field effect transistor (PMOSFET) (hereinafter abbreviated as "PFET") gate stack 104 on common substrate 106. As will be apparent from the description below, the term "metal gate stack," as used herein, refers to the presence of a metal gate layer in the gate stack, i.e., the gate stack is a metal-gated structure. According to an exemplary embodiment, substrate 106 is a silicon-on-insulator (SOI) substrate having shallow-trench-isolation (STI) region 105 located in between NFET gate stack 102 and PFET gate stack 104. As will be described, for example, in conjunction with the description of FIG. 3, below, NFET gate stack 102 and PFET gate stack 104 can form the gate regions of an NFET and a PFET, respectively, integrated within a common planar MOS device.

Namely, NFET gate stack 102 comprises NFET dielectric layer 108 on substrate 106, metal gate layer 110 over a side of NFET dielectric layer 108 opposite substrate 106 and partially silicided silicon region 112 over a side of metal gate layer 110 opposite NFET dielectric layer 108. The metal gate layer 110 and partially silicided silicon region 112 form a gate electrode over dielectric layer 108. As such, NFET gate stack 102 is a metal-gated structure.

NFET dielectric layer 108 can comprise any suitable metal-gated dielectric material(s), including, but not limited to, one or more high-k materials, such as hafnium oxide ($HfO_2$), tantalum oxide ($Ta_2O_5$), titanium oxide ($TiO_2$), aluminum oxide ($Al_2O_3$) and lanthanum oxide ($La_2O_5$). Metal gate layer 110 can comprise any suitable metal gate material(s), including, but not limited to, one or more of tantalum (Ta), tantalum nitride (TaN), tantalum carbide nitride (TaCN), tantalum silicon nitride (TaSiN), tantalum silicide (TaSi), aluminum nitride (AlN), tungsten (W) and molybdenum (Mo).

As will be described, for example, in conjunction with the description of FIG. 14, below, the silicon region, i.e., silicon region 112, can be formed from two separate silicon layers having a same composition as, or a different composition from, one another. According to an exemplary embodiment, silicon region 112 is formed from silicon layer 112a over a side of metal gate layer 110 opposite NFET dielectric layer 108, and silicon layer 112b over a side of silicon layer 112a opposite metal gate layer 110 (with interface 114 defined between silicon layers 112a and 112b), wherein silicon layer 112a comprises either polysilicon or amorphous silicon, and silicon layer 112b similarly comprises either polysilicon or amorphous silicon. Further, silicon layer 112b preferably has a thickness that is greater than a thickness of silicon layer 112a. By way of example only, silicon layer 112a can have a thickness of up to about 20 nanometers (nm), while silicon layer 112b can have a thickness of between about 50 nm and about 80 nm.

In the present teachings it has been discovered that an interface between silicon layers in a gate stack, e.g., interface 114 between silicon layers 112a and 112b, can pose a problem. Namely, any amount of oxidation present at the interface of the layers can act as a barrier to dopant diffusion during gate formation and/or cause an increase in resistance through the gate. Thus, if a top surface of silicon layer 112a is not properly cleaned before silicon layer 112b is deposited thereon, then such oxidation can be present at interface 114.

To avoid the problems associated with oxidation at the interface between the silicon layers of the gate structure, it has been discovered by way of the present teachings, that silicidation of the top silicon layer, past the interface and into at least a portion of the bottom silicon layer eliminates the interface issue, i.e., by eliminating the barrier. Namely, according to the present teachings, silicon region 112 is partially silicided, such that a silicide region 116 is formed that entirely consumes silicon layer 112b and a portion of silicon layer 112a. Alternatively, the entire silicon region can be silicided. See, for example, FIG. 2 (described below). Whether the silicon region is partially or fully silicided, what is important is that the silicide region extends through the interface between the silicon layers. When the silicon region is partially silicided, the non-silicided portion of the silicon region (i.e., shown in FIG. 1 as the region of silicon layer 112a below silicide region 116) can be doped. Suitable dopants include, but are not limited to phosphorous (P) or arsenic (As).

Metals that can be used in forming silicide region 116, include, but are not limited to, one or more of nickel (Ni) and cobalt (Co). The process used for forming a silicide region, i.e., silicide region 116, will be described, for example, in conjunction with the description of FIG. 14, below.

PFET gate stack 104 has a different structure from NFET gate stack 102. Namely, PFET gate stack 104 comprises PFET dielectric layer 118 over substrate 106 and partially silicided silicon region 120 over a side of PFET dielectric layer 118 opposite substrate 106. Partially silicided silicon region 120 forms a gate electrode over PFET dielectric layer 118.

PFET dielectric layer 118 can comprise any suitable dielectric material(s), including, but not limited to, an oxynitride, such as silicon oxynitride. As will be described, for example, in conjunction with the description of FIG. 14, below, silicon region 120 of PFET gate stack 104 can be formed from two separate silicon layers having a same composition as, or a different composition from, one another. According to an exemplary embodiment, silicon region 120 is formed from silicon layer 120a over a side of PFET dielectric layer 118 opposite substrate 106, and silicon layer 120b over a side of silicon layer 120a opposite PFET dielectric layer 118 (with interface 122 defined between silicon layers 120a and 120b), wherein silicon layer 120a comprises either polysilicon or amorphous silicon, and silicon layer 120b similarly comprises either polysilicon or amorphous silicon. Further, silicon layer 120b preferably has a thickness that is greater than a thickness of silicon layer 120a. By way of example only, silicon layer 120a can have a thickness of up to about 20 nm, while silicon layer 120b can have a thickness of between about 50 nm and about 80 nm.

As described above, oxidation present at the interface between silicon layers in a gate structure can act as a barrier to dopant diffusion during formation of the gate and/or cause an increase in resistance through the gate. Thus, silicon region 120 is partially silicided, such that a silicide region 124 is formed that entirely consumes silicon layer 120b and a portion of silicon layer 120a. Alternatively, the entire silicon region can be silicided. See, for example, FIG. 2 (described below). When the silicon region is partially silicided, the non-silicided portion of the silicon region (i.e., shown in FIG. 1 as the region of silicon layer 120a below silicide region 124) can be doped. Suitable dopants include, but are not limited to, boron (B) or borondifluoride ($BF_2$).

Metals that can be used in forming silicide region 124, include, but are not limited to, one or more of Ni and Co. The process used for forming a silicide region, i.e., silicide region 124, will be described, for example, in conjunction with the description of FIG. 14, below.

Advantageously, with the present partially silicided gate stacks, the exact thickness of the silicide region is not critical to device performance. Additionally, since the silicide region is not in contact with the metal gate layer, the workfunction of the gate stack is determined by the doping of the underlying non-silicided portion of the silicon region and not by the silicide region. Therefore, the structure is immune to complications arising from silicide thickness tolerances and threshold voltage ($V_t$) control.

Figure 2:
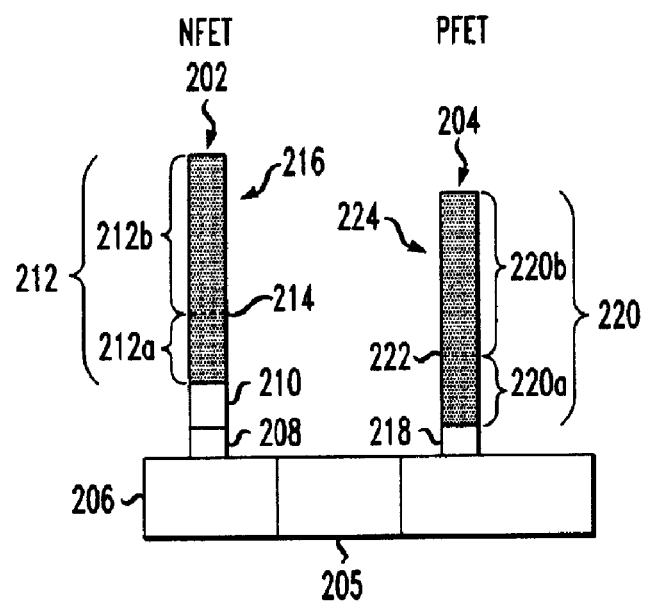
FIG. 2 is a diagram illustrating an exemplary fully silicided metal NFET gate stack integrated with an exemplary fully silicided PFET gate stack on a common substrate according to an embodiment of the present invention.

FIG. 2 is a diagram illustrating fully silicided metal NFET gate stack 202 integrated with fully silicided PFET gate stack 204 on common substrate 206. According to an exemplary embodiment, substrate 206 is a SOI substrate having STI region 205 located in between NFET gate stack 202 and PFET gate stack 204. As will be described, for example, in conjunction with the description of FIG. 4, below, NFET gate stack 202 and PFET gate stack 204 can form the gate regions of an NFET and a PFET, respectively, integrated within a common planar MOS device.

Namely, NFET gate stack 202 comprises NFET dielectric layer 208 on substrate 206, metal gate layer 210 over a side of NFET dielectric layer 208 opposite substrate 206 and fully silicided silicon region 212 over a side of metal gate layer 210 opposite NFET dielectric layer 208. The metal gate layer 210 and fully silicided silicon region 212 form a gate electrode over NFET dielectric layer 208. As such, NFET gate stack 202 is a metal-gated structure.

NFET dielectric layer 208 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 210 can comprise any suitable metal gate material(s), including, but not limited to, one or more of Ta, TaN, TaCN, TaSiN, TaSi, AlN, W and Mo.

As will be described, for example, in conjunction with the description of FIG. 14, below, the silicon region, i.e., silicon region 212, can be formed from two separate silicon layers having a same composition as, or a different composition from, one another. According to an exemplary embodiment, silicon region 212 is formed from silicon layer 212a over a side of metal gate layer 210 opposite NFET dielectric layer 208, and silicon layer 212b over a side of silicon layer 212a opposite metal gate layer 210 (with interface 214 defined between silicon layers 212a and 212b), wherein silicon layer 212a comprises either polysilicon or amorphous silicon, and silicon layer 212b similarly comprises either polysilicon or amorphous silicon. Further, silicon layer 212b preferably has a thickness that is greater than a thickness of silicon layer 212a. By way of example only, silicon layer 212a can have a thickness of up to about 20 nm, while silicon layer 212b can have a thickness of between about 50 nm and about 80 nm.

Silicon region 212 is fully silicided, such that a silicide region 216 is formed that entirely consumes both silicon layers 212a and 212b. As described above, the silicide region (in this case silicide region 216) should extend through the interface between the silicon layers to eliminate the problems associated with oxidation at this interface. A fully silicided silicon region 212 meets this criteria.

Further, when the silicon region is fully silicided, doping of the silicon region is no longer needed. Thus, the fully silicided gate stack embodiments, described both here and below, provide an added benefit over conventional MOSFETs in that potential unwanted dopant variations (created, for example, as a result of intra-diffusion between MOSFETs placed at a tight pitch) are all together eliminated.

Metals that can be used in forming silicide region 216, include, but are not limited to, one or more of Ni and Co. The process used for forming a silicide region, i.e., silicide region 216, will be described, for example, in conjunction with the description of FIG. 14, below.

PFET gate stack 204 has a different structure from NFET gate stack 202. Namely, PFET gate stack 204 comprises PFET dielectric layer 218 over substrate 206 and fully silicided silicon region 220 over a side of PFET dielectric layer 218 opposite substrate 206. Fully silicided silicon region 220 forms a gate electrode over PFET dielectric layer 218.

PFET dielectric layer 218 can comprise any suitable dielectric material(s), including, but not limited to, an oxynitride, such as silicon oxynitride. As will be described, for example, in conjunction with the description of FIG. 14, below, the silicon region, i.e., silicon region 220, can be formed from two separate silicon layers having a same composition as, or a different composition from, one another. According to an exemplary embodiment, silicon region 220 is formed from silicon layer 220a over a side of PFET dielectric layer 218 opposite substrate 206, and silicon layer 220b over a side of silicon layer 220a opposite PFET dielectric layer 218 (with interface 222 defined between silicon layers 220a and 220b), wherein silicon layer 220a comprises either polysilicon or amorphous silicon, and silicon layer 220b similarly comprises either polysilicon or amorphous silicon. Further, silicon layer 220b preferably has a thickness that is greater than a thickness of silicon layer 220a. By way of example only, silicon layer 220a can have a thickness of up to about 20 nm, while silicon layer 220b can have a thickness of between about 50 nm and about 80 nm.

Silicon region 220 is fully silicided, such that a silicide region 224 is formed that entirely consumes silicon layers 220a and 220b. Thus, silicide region 224 extends through the interface between silicon layers 220a and 220b.

Metals that can be used in forming silicide region 224, include, but are not limited to, one or more of Ni and Co. The process used for forming a silicide region, i.e., silicide region 224, will be described, for example, in conjunction with the description of FIG. 14, below.

FIG. 3 is a diagram illustrating exemplary planar MOS device 300. Planar MOS device 300 comprises an NFET and a PFET integrated on a common substrate 306 separated by STI region 305.

Specifically, the NFET comprises partially silicided gate stack 102 over substrate 306, nitride spacers 301, source 302s, drain 302d and channel 302c. Partially silicided gate stack 102 was described, for example, in conjunction with the description of FIG. 1, above. Partially silicided gate stack 102 forms a gate region of the NFET.

The PFET comprises partially silicided gate stack 104 over substrate 306, nitride spacers 303, source 304s, drain 304d and channel 304c. Partially silicided gate stack 104 was also described, for example, in conjunction with the description of FIG. 1, above. Partially silicided gate stack 104 forms a gate region of the PFET.

FIG. 4 is a diagram illustrating exemplary planar MOS device 400. Planar MOS device 400 comprises an NFET and a PFET on a common substrate 406 separated by STI region 405.

Specifically, the NFET comprises fully silicided gate stack 202 over substrate 406, nitride spacers 401, source 402s, drain 402d and channel 402c. Fully silicided gate stack 202 was described, for example, in conjunction with the description of FIG. 2, above. Fully silicided gate stack 202 forms a gate region of the NFET.

The PFET comprises fully silicided gate stack 204 over substrate 406, nitride spacers 403, source 404s, drain 404d and channel 404c. Fully silicided gate stack 204 was also described, for example, in conjunction with the description of FIG. 2, above. Fully silicided gate stack 204 forms a gate region of the PFET.

Figure 5:
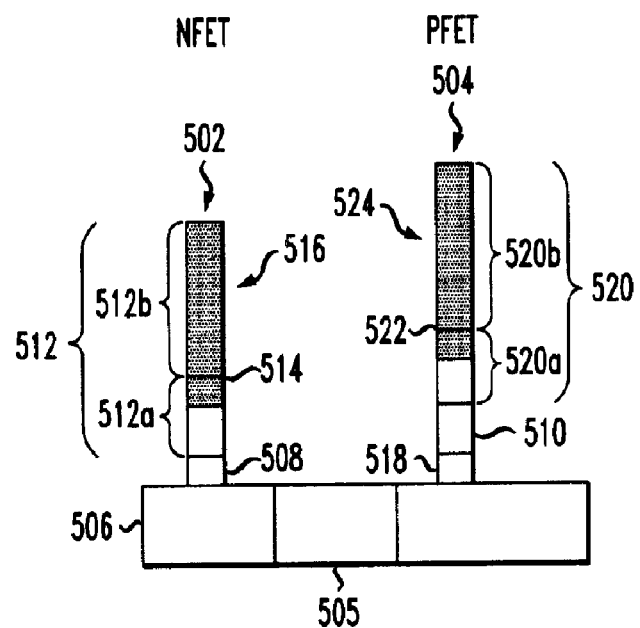
FIG. 5 is a diagram illustrating an exemplary partially silicided NFET gate stack integrated with an exemplary partially silicided metal PFET gate stack on a common substrate according to an embodiment of the present invention.

FIG. 5 is a diagram illustrating partially silicided NFET gate stack 502 integrated with partially silicided metal PFET gate stack 504 on common substrate 506. According to an exemplary embodiment, substrate 506 is a SOI substrate having STI region 505 located in between NFET gate stack 502 and PFET gate stack 504. As will be described, for example, in conjunction with the description of FIG. 7, below, NFET gate stack 502 and PFET gate stack 504 can form the gate regions of an NFET and a PFET, respectively, integrated within a common planar MOS device.

Namely, NFET gate stack 502 comprises NFET dielectric layer 508 over substrate 506 and partially silicided silicon region 512 over a side of NFET dielectric layer 508 opposite substrate 506. Partially silicided silicon region 512 forms a gate electrode over NFET dielectric layer 508.

NFET dielectric layer 508 can comprise any suitable dielectric material(s), including, but not limited to, an oxynitride, such as silicon oxynitride. As will be described, for example, in conjunction with the description of FIG. 15, below, the silicon region, i.e., silicon region 512, of NFET gate stack 502 can be formed from two separate silicon layers having a same composition as, or a different composition from, one another. According to an exemplary embodiment, silicon region 512 is formed from silicon layer 512a over a side of NFET dielectric layer 508 opposite substrate 506, and silicon layer 512b over a side of silicon layer 512a opposite NFET dielectric layer 508 (with interface 514 defined between silicon layers 512a and 512b), wherein silicon layer 512a comprises either polysilicon or amorphous silicon, and silicon layer 512b similarly comprises either polysilicon or amorphous silicon.

As described above, oxidation present at the interface between silicon layers in a gate structure can act as a barrier to dopant diffusion during formation of the gate and/or cause an increase in resistance through the gate. Thus, silicon region 512 is partially silicided, such that a silicide region 516 is formed that entirely consumes silicon layer 512b and a portion of silicon layer 512a. Alternatively, the entire silicon region can be silicided. See, for example, FIG. 6 (described below). When the silicon region is partially silicided, the non-silicided portion of the silicon region (i.e., shown in FIG. 5 as the region of silicon layer 512a below silicide region 516) can be doped. Suitable dopants include, but are not limited to P or As. Metals that can be used in forming silicide region 516, include, but are not limited to, one or more of Ni and Co.

PFET gate stack 504 has a different structure from NFET gate stack 502. PFET gate stack 504 comprises PFET dielectric layer 518 on substrate 506, metal gate layer 510 over a side of PFET dielectric layer 518 opposite substrate 506 and partially silicided silicon region 520 over a side of metal gate layer 510 opposite PFET dielectric layer 518. The metal gate layer 510 and partially silicided silicon region 520 form a gate electrode over dielectric layer 518. As such, PFET gate stack 504 is a metal-gated structure.

PFET dielectric layer 518 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 510 can comprise any suitable metal gate material(s), including, but not limited to, one or more of Ta, TaN, TaCN, TaSiN, TaSi, MN, W and Mo.

As will be described, for example, in conjunction with the description of FIG. 15, below, the silicon region, i.e., silicon region 520, can be formed from two separate silicon layers having a same composition as, or a different composition from, one another. According to an exemplary embodiment, silicon region 520 is formed from silicon layer 520a over a side of metal gate layer 510 opposite PFET dielectric layer 518, and silicon layer 520b over a side of silicon layer 520a opposite metal gate layer 510 (with interface 522 defined between silicon layers 520a and 520b), wherein silicon layer 520a comprises either polysilicon or amorphous silicon, and silicon layer 520b similarly comprises either polysilicon or amorphous silicon.

As described above, oxidation present at the interface between silicon layers in a gate structure can act as a barrier to dopant diffusion during formation of the gate and/or cause an increase in resistance through the gate. Thus, silicon region 520 is partially silicided, such that a silicide region 524 is formed that entirely consumes silicon layer 520b and a portion of silicon layer 520a. Alternatively, the entire silicon region can be silicided. See, for example, FIG. 6 (described below). Whether the silicon region is partially or fully silicided, what is important is that the silicide region extends through the interface between the silicon layers. When the silicon region is partially silicided, the non-silicided portion of the silicon region (i.e., shown in FIG. 5 as the region of silicon layer 520a below silicide region 524) can be doped. Suitable dopants include, but are not limited to B or $BF_2$. Metals that can be used in forming silicide region 524, include, but are not limited to, one or more of Ni and Co.

Figure 6:
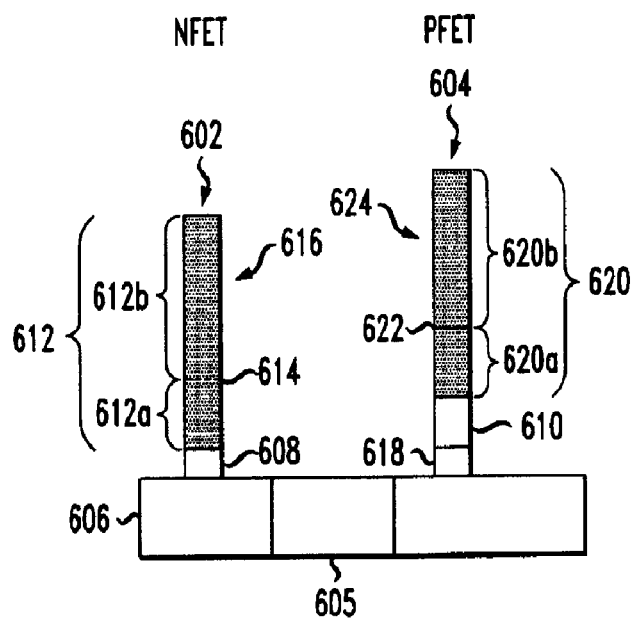
FIG. 6 is a diagram illustrating an exemplary fully silicided NFET gate stack integrated with an exemplary fully silicided metal PFET gate stack on a common substrate according to an embodiment of the present invention.

FIG. 6 is a diagram illustrating fully silicided NFET gate stack 602 integrated with fully silicided metal PFET gate stack 604 on common substrate 606. According to an exemplary embodiment, substrate 606 is a SOI substrate having STI region 605 located in between NFET gate stack 602 and PFET gate stack 604. As will be described, for example, in conjunction with the description of FIG. 8, below, NFET gate stack 602 and PFET gate stack 604 can form the gate regions of an NFET and a PFET, respectively, integrated within a common planar MOS device.

Namely, NFET gate stack 602 comprises NFET dielectric layer 608 over substrate 606 and fully silicided silicon region 612 over a side of NFET dielectric layer 608 opposite substrate 606. Fully silicided silicon region 612 forms a gate electrode over NFET dielectric layer 608.

NFET dielectric layer 608 can comprise any suitable dielectric material(s), including, but not limited to, an oxynitride, such as silicon oxynitride. As will be described, for example, in conjunction with the description of FIG. 15, below, the silicon region, i.e., silicon region 612, can be formed from two separate silicon layers having a same composition as, or a different composition from, one another. According to an exemplary embodiment, silicon region 612 is formed from silicon layer 612a over a side of NFET dielectric layer 608 opposite substrate 606, and silicon layer 612b over a side of silicon layer 612a opposite NFET dielectric layer 608 (with interface 614 defined between silicon layers 612a and 612b), wherein silicon layer 612a comprises either polysilicon or amorphous silicon, and silicon layer 612b similarly comprises either polysilicon or amorphous silicon.

Silicon region 612 is fully silicided, such that a silicide region 616 is formed that entirely consumes silicon layers 612a and 612b. Thus, silicide region 616 extends through the interface between silicon layers 612a and 612b. Metals that can be used in forming silicide region 616, include, but are not limited to, one or more of Ni and Co.

PFET gate stack 604 has a different structure from NFET gate stack 602. PFET gate stack 604 comprises PFET dielectric layer 618 on substrate 606, metal gate layer 610 over a side of PFET dielectric layer 618 opposite substrate 606 and fully silicided silicon region 620 over a side of metal gate layer 610 opposite PFET dielectric layer 618. The metal gate layer 610 and fully silicided silicon region 620 form a gate electrode over PFET dielectric layer 618. As such, PFET gate stack 604 is a metal-gated structure.

PFET dielectric layer 618 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 610 can comprise any suitable metal gate material(s), including, but not limited to, one or more of Ta, TaN, TaCN, TaSiN, TaSi, AlN, W and Mo.

As will be described, for example, in conjunction with the description of FIG. 15, below, the silicon region, i.e., silicon region 620, can be formed from two separate silicon layers having a same composition as, or a different composition from, one another. According to an exemplary embodiment, silicon region 620 is formed from silicon layer 620a over a side of metal gate layer 610 opposite PFET dielectric layer 618, and silicon layer 620b over a side of silicon layer 620a opposite metal gate layer 610 (with interface 622 defined between silicon layers 620a and 620b), wherein silicon layer 620a comprises either polysilicon or amorphous silicon, and silicon layer 620b similarly comprises either polysilicon or amorphous silicon.

Silicon region 620 is fully silicided, such that a silicide region 624 is formed that entirely consumes both silicon layers 620a and 620b. As described above, the silicide region (in this case silicide region 624) should extend through the interface between the silicon layers to eliminate the problems associated with oxidation at this interface. A fully silicided silicon region 620 meets this criteria. Metals that can be used in forming silicide region 624, include, but are not limited to, one or more of Ni and Co.

Further, when the silicon region is fully silicided, doping of the silicon region is no longer needed. Thus, the fully silicided gate stack embodiments described herein provide an added benefit over conventional MOSFETs in that potential unwanted dopant variations (created, for example, as a result of intra-diffusion between MOSFETs placed at a tight pitch) are all together eliminated.

FIG. 7 is a diagram illustrating exemplary planar MOS device 700. Planar MOS device 700 comprises an NFET and a PFET integrated on a common substrate 706 separated by STI region 705.

Specifically, the NFET comprises partially silicided gate stack 502 over substrate 706, nitride spacers 701, source 702s, drain 702d and channel 702c. Partially silicided gate stack 502 was described, for example, in conjunction with the description of FIG. 5, above. Partially silicided gate stack 502 forms a gate region of the NFET.

The PFET comprises partially silicided gate stack 504 over substrate 706, nitride spacers 703, source 704s, drain 704d and channel 704c. Partially silicided gate stack 504 was also described, for example, in conjunction with the description of FIG. 5, above. Partially silicided gate stack 504 forms a gate region of the PFET.

FIG. 8 is a diagram illustrating exemplary planar MOS device 800. Planar MOS device 800 comprises an NFET and a PFET on a common substrate 806 separated by STI region 805.

Specifically, the NFET comprises fully silicided gate stack 602 over substrate 806, nitride spacers 801, source 802s, drain 802d and channel 802c. Fully silicided gate stack 602 was described, for example, in conjunction with the description of FIG. 6, above. Fully silicided gate stack 602 forms a gate region of the NFET.

The PFET comprises fully silicided gate stack 604 over substrate 806, nitride spacers 803, source 804s, drain 804d and channel 804c. Fully silicided gate stack 604 was also described, for example, in conjunction with the description of FIG. 6, above. Fully silicided gate stack 604 forms a gate region of the PFET.

Figure 9:
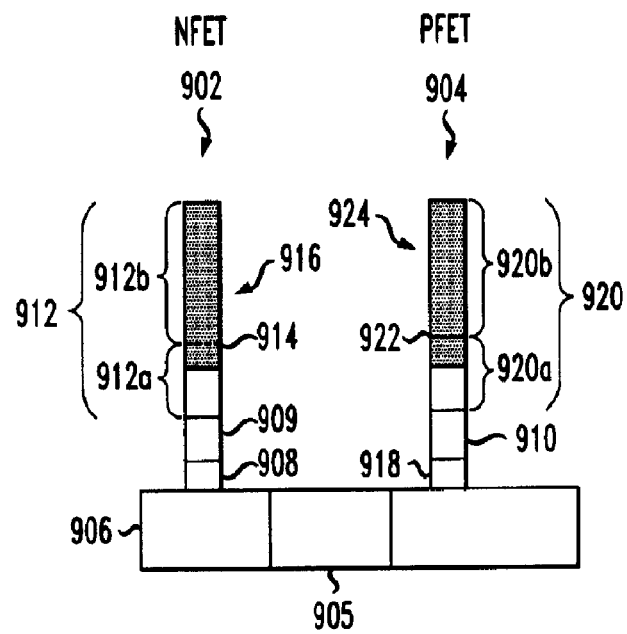
FIG. 9 is a diagram illustrating an exemplary partially silicided metal NFET gate stack integrated with an exemplary partially silicided metal PFET gate stack on a common substrate according to an embodiment of the present invention.

FIG. 9 is a diagram illustrating partially silicided metal NFET gate stack 902 integrated with partially silicided metal PFET gate stack 904 on common substrate 906. According to an exemplary embodiment, substrate 906 is a SOI substrate having STI region 905 located in between NFET gate stack 902 and PFET gate stack 904. As will be described, for example, in conjunction with the description of FIG. 11, below, NFET gate stack 902 and PFET gate stack 904 can form the gate regions of an NFET and a PFET, respectively, integrated within a common planar MOS device.

Namely, NFET gate stack 902 comprises NFET dielectric layer 908 on substrate 906, metal gate layer 909 over a side of NFET dielectric layer 908 opposite substrate 906 and partially silicided silicon region 912 over a side of metal gate layer 909 opposite NFET dielectric layer 908. The metal gate layer 909 and partially silicided silicon region 912 form a gate electrode over dielectric layer 908. As such, NFET gate stack 902 is a metal-gated structure.

NFET dielectric layer 908 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 909 can comprise any suitable metal gate material(s), including, but not limited to, one or more of Ta, TaN, TaCN, TaSiN, TaSi, AlN, W and Mo.

As will be described, for example, in conjunction with the description of FIG. 16, below, the silicon region, i.e., silicon region 912, can be formed from two separate silicon layers having a same composition as, or a different composition from, one another. According to an exemplary embodiment, silicon region 912 is formed from silicon layer 912a over a side of metal gate layer 909 opposite NFET dielectric layer 908, and silicon layer 912b over a side of silicon layer 912a opposite metal gate layer 909 (with interface 914 defined between silicon layers 912a and 912b), wherein silicon layer 912a comprises either polysilicon or amorphous silicon, and silicon layer 912b similarly comprises either polysilicon or amorphous silicon.

As described above, oxidation present at the interface between silicon layers in a gate structure can act as a barrier to dopant diffusion during formation of the gate and/or cause an increase in resistance through the gate. Thus, silicon region 912 is partially silicided, such that a silicide region 916 is formed that entirely consumes silicon layer 912b and a portion of silicon layer 912a. Alternatively, the entire silicon region can be silicided. See, for example, FIG. 10 (described below). Whether the silicon region is partially or fully silicided, what is important is that the silicide region extends through the interface between the silicon layers. When the silicon region is partially silicided, the non-silicided portion of the silicon region (i.e., shown in FIG. 9 as the region of silicon layer 912a below silicide region 916) can be doped. Suitable dopants include, but are not limited to P or As. Metals that can be used in forming silicide region 916, include, but are not limited to, one or more of Ni and Co.

PFET gate stack 904 comprises PFET dielectric layer 918 on substrate 906, metal gate layer 910 over a side of PFET dielectric layer 918 opposite substrate 906 and partially silicided silicon region 920 over a side of metal gate layer 910 opposite PFET dielectric layer 918. The metal gate layer 910 and partially silicided silicon region 920 form a gate electrode over dielectric layer 918. As such, PFET gate stack 904 is a metal-gated structure.

PFET dielectric layer 918 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 910 can comprise any suitable metal gate material(s), including, but not limited to, one or more of Ta, TaN, TaCN, TaSiN, TaSi, MN, W and Mo.

As will be described, for example, in conjunction with the description of FIG. 16, below, the silicon region, i.e., silicon region 920, can be formed from two separate silicon layers having a same composition as, or a different composition from, one another. According to an exemplary embodiment, silicon region 920 is formed from silicon layer 920a over a side of metal gate layer 910 opposite PFET dielectric layer 918, and silicon layer 920b over a side of silicon layer 920a opposite metal gate layer 910 (with interface 922 defined between silicon layers 920a and 920b), wherein silicon layer 920a comprises either polysilicon or amorphous silicon, and silicon layer 920b similarly comprises either polysilicon or amorphous silicon.

As described above, oxidation present at the interface between silicon layers in a gate structure can act as a barrier to dopant diffusion during formation of the gate and/or cause an increase in resistance through the gate. Thus, silicon region 920 is partially silicided, such that a silicide region 924 is formed that entirely consumes silicon layer 920b and a portion of silicon layer 920a. Alternatively, the entire silicon region can be silicided. See, for example, FIG. 10 (described below). Whether the silicon region is partially or fully silicided, what is important is that the silicide region extends through the interface between the silicon layers. When the silicon region is partially silicided, the non-silicided portion of the silicon region (i.e., shown in FIG. 9 as the region of silicon layer 920a below silicide region 924) can be doped. Suitable dopants include, but are not limited to B or $BF_2$. Metals that can be used in forming silicide region 924, include, but are not limited to, one or more of Ni and Co.

Figure 10:
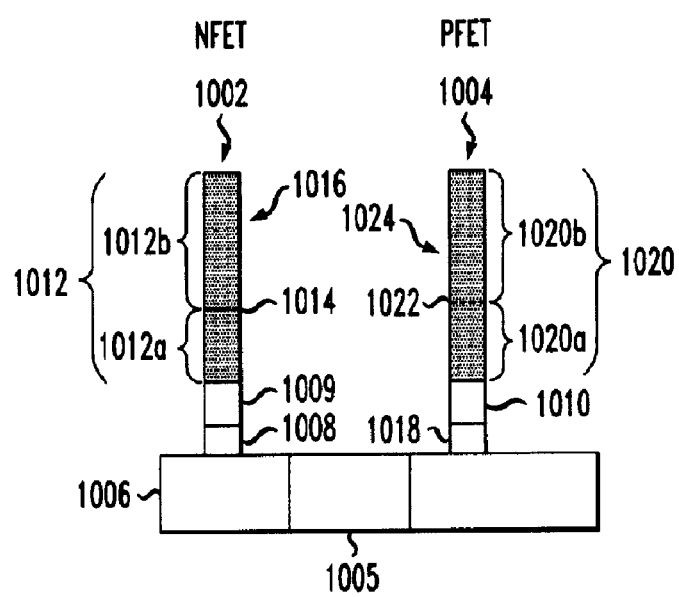
FIG. 10 is a diagram illustrating an exemplary fully silicided metal NFET gate stack integrated with an exemplary fully silicided metal PFET gate stack on a common substrate according to an embodiment of the present invention.

FIG. 10 is a diagram illustrating fully silicided metal NFET gate stack 1002 integrated with fully silicided metal PFET gate stack 1004 on common substrate 1006. According to an exemplary embodiment, substrate 1006 is a SOI substrate having STI region 1005 located in between NFET gate stack 1002 and PFET gate stack 1004. As will be described, for example, in conjunction with the description of FIG. 12, below, NFET gate stack 1002 and PFET gate stack 1004 can form the gate regions of an NFET and a PFET, respectively, integrated within a common planar MOS device.

NFET gate stack 1002 comprises NFET dielectric layer 1008 on substrate 1006, metal gate layer 1009 over a side of NFET dielectric layer 1008 opposite substrate 1006 and fully silicided silicon region 1012 over a side of metal gate layer 1009 opposite NFET dielectric layer 1008. The metal gate layer 1009 and fully silicided silicon region 1012 form a gate electrode over NFET dielectric layer 1008. As such, NFET gate stack 1002 is a metal-gated structure.

NFET dielectric layer 1008 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 1009 can comprise any suitable metal gate material(s), including, but not limited to, one or more of Ta, TaN, TaCN, TaSiN, TaSi, MN, W and Mo.

As will be described, for example, in conjunction with the description of FIG. 16, below, the silicon region, i.e., silicon region 1012, can be formed from two separate silicon layers having a same composition as, or a different composition from, one another. According to an exemplary embodiment, silicon region 1012 is formed from silicon layer 1012a over a side of metal gate layer 1009 opposite PFET dielectric layer 1008, and silicon layer 1012b over a side of silicon layer 1012a opposite metal gate layer 1009 (with interface 1014 defined between silicon layers 1012a and 1012b), wherein silicon layer 1012a comprises either polysilicon or amorphous silicon, and silicon layer 1012b similarly comprises either polysilicon or amorphous silicon.

Silicon region 1012 is fully silicided, such that a silicide region 1016 is formed that entirely consumes both silicon layers 1012a and 1012b. As described above, the silicide region (in this case silicide region 1016) should extend through the interface between the silicon layers to eliminate the problems associated with oxidation at this interface. A fully silicided silicon region 1012 meets these criteria. Metals that can be used in forming silicide region 1016, include, but are not limited to, one or more of Ni and Co.

Further, when the silicon region is fully silicided, doping of the silicon region is no longer needed. Thus, the fully silicided gate stack embodiments described herein provide an added benefit over conventional MOSFETs in that potential unwanted dopant variations (created, for example, as a result of intra-diffusion between MOSFETs placed at a tight pitch) are eliminated all together.

PFET gate stack 1004 comprises PFET dielectric layer 1018 on substrate 1006, metal gate layer 1010 over a side of PFET dielectric layer 1018 opposite substrate 1006 and fully silicided silicon region 1020 over a side of metal gate layer 1010 opposite PFET dielectric layer 1018. The metal gate layer 1010 and fully silicided silicon region 1020 form a gate electrode over PFET dielectric layer 1018. As such, PFET gate stack 1004 is a metal-gated structure.

PFET dielectric layer 1018 can comprise any suitable metal-gated dielectric material(s), including, but not limited to, one or more high-k materials, such as $HfO_2$, $Ta_2O_5$, $TiO_2$, $Al_2O_3$ and $La_2O_5$. Metal gate layer 1010 can comprise any suitable metal gate material(s), including, but not limited to, one or more of Ta, TaN, TaCN, TaSiN, TaSi, AlN, W and Mo.

As will be described, for example, in conjunction with the description of FIG. 16, below, the silicon region, i.e., silicon region 1020, can be formed from two separate silicon layers having a same composition as, or a different composition from, one another. According to an exemplary embodiment, silicon region 1020 is formed from silicon layer 1020a over a side of metal gate layer 1010 opposite PFET dielectric layer 1018, and silicon layer 1020b over a side of silicon layer 1020a opposite metal gate layer 1010 (with interface 1022 defined between silicon layers 1020a and 1020b), wherein silicon layer 1020a comprises either polysilicon or amorphous silicon, and silicon layer 1020b similarly comprises either polysilicon or amorphous silicon.

Silicon region 1020 is fully silicided, such that a silicide region 1024 is formed that entirely consumes both silicon layers 1020a and 1020b. As described above, the silicide region (in this case silicide region 1024) should extend through the interface between the silicon layers to eliminate the problems associated with oxidation at this interface. A fully silicided silicon region 1020 meets this criteria.

Further, when the silicon region is fully silicided, doping of the silicon region is no longer needed. Thus, the fully silicided gate stack embodiments described herein provide an added benefit over conventional MOSFETs in that potential unwanted dopant variations (created, for example, as a result of intra-diffusion between MOSFETs placed at a tight pitch) are eliminated all together. Metals that can be used in forming silicide region 1024, include, but are not limited to, one or more of Ni and Co.

FIG. 11 is a diagram illustrating exemplary planar MOS device 1100. Planar MOS device 1100 comprises an NFET and a PFET integrated on a common substrate 1106 separated by STI region 1105.

Specifically, the NFET comprises partially silicided gate stack 902 over substrate 1106, nitride spacers 1101, source 1102s, drain 1102d and channel 1102c. Partially silicided gate stack 902 was described, for example, in conjunction with the description of FIG. 9, above. Partially silicided gate stack 902 forms a gate region of the NFET.

The PFET comprises partially silicided gate stack 904 over substrate 1106, nitride spacers 1103, source 1104s, drain 1104d and channel 1104c. Partially silicided gate stack 904 was also described, for example, in conjunction with the description of FIG. 9, above. Partially silicided gate stack 904 forms a gate region of the PFET.

FIG. 12 is a diagram illustrating exemplary planar MOS device 1200. Planar MOS device 1200 comprises an NFET and a PFET on a common substrate 1206 separated by STI region 1205.

Specifically, the NFET comprises fully silicided gate stack 1002 over substrate 1206, nitride spacers 1201, source 1202s, drain 1202d and channel 1202c. Fully silicided gate stack 1002 was described, for example, in conjunction with the description of FIG. 10, above. Fully silicided gate stack 1002 forms a gate region of the NFET.

The PFET comprises fully silicided gate stack 1004 over substrate 1206, nitride spacers 1203, source 1204s, drain 1204d and channel 1204c. Fully silicided gate stack 1004 was also described, for example, in conjunction with the description of FIG. 10, above. Fully silicided gate stack 1004 forms a gate region of the PFET.

The instant teachings further include one or more of the NFET/PFET gate stack configurations described above (i.e., partially or fully silicided) together with other NFET and PFET gate stacks (which may also be partially or fully silicided) integrated on a common substrate. By way of example only, according to the embodiment shown illustrated in FIG. 13, partially silicided NFET gate stack 102 and partially silicided PFET gate stack 104, described, for example, in conjunction with the description of FIG. 1, above, are integrated with partially silicided NFET gate stack 1302 and partially silicided PFET gate stack 1304 on common substrate 1306. According to an exemplary embodiment, substrate 1306 is a SOI substrate having STI region 1305 located in between NFET gate stack 102 and PFET gate stack 104, STI region 1307 located in between PFET gate stack 104 and NFET gate stack 1302 and STI region 1309 located in between NFET gate stack 1302 and PFET gate stack 1304. NFET gate stack 102/NFET gate stack 1302 and PFET gate stack 104/PFET gate stack 1304 can form the gate regions of NFETs and PFETs, respectively, integrated within a common planar MOS device.

NFET gate stack 102 and PFET gate stack 104, were described, for example, in conjunction with the description of FIG. 1, above. As described above, NFET gate stack 102 is a metal-gated structure.

NFET gate stack 1302 comprises NFET dielectric layer 1308 over substrate 1306 and partially silicided silicon region 1312 over a side of NFET dielectric layer 1308 opposite substrate 1306. Partially silicided silicon region 1312 forms a gate electrode over NFET dielectric layer 1308.

NFET dielectric layer 1308 can comprise any suitable dielectric material(s), including, but not limited to, an oxynitride, such as silicon oxynitride. Silicon region 1312 of NFET gate stack 1302 can be formed from two separate silicon layers having a same composition as, or a different composition from, one another. According to an exemplary embodiment, silicon region 1312 is formed from silicon layer 1312a over a side of NFET dielectric layer 1308 opposite substrate 1306, and silicon layer 1312b over a side of silicon layer 1312a opposite NFET dielectric layer 1308 (with interface 1314 defined between silicon layers 1312a and 1312b), wherein silicon layer 1312a comprises either polysilicon or amorphous silicon, and silicon layer 1312b similarly comprises either polysilicon or amorphous silicon.

Silicon region 1312 is partially silicided, such that a silicide region 1316 is formed that entirely consumes silicon layer 1312b and a portion of silicon layer 1312a. Alternatively, the entire silicon region 1312 can be silicided. When the silicon region is partially silicided, the non-silicided portion of the silicon region (i.e., shown in FIG. 13 as the region of silicon layer 1312a below silicide region 1316) can be doped. Suitable dopants include, but are not limited to P or As. Suitable metals for use in forming silicide region 1316, include, but are not limited to, one or more of Ni and Co.

PFET gate stack 1304 comprises PFET dielectric layer 1318 over substrate 1306 and partially silicided silicon region 1320 over a side of PFET dielectric layer 1318 opposite substrate 1306. Partially silicided silicon region 1320 forms a gate electrode over PFET dielectric layer 1318.

PFET dielectric layer 1318 can comprise any suitable dielectric material(s), including, but not limited to, an oxynitride, such as silicon oxynitride. Silicon region 1320 of PFET gate stack 1304 can be formed from two separate silicon layers having a same composition as, or a different composition from, one another. According to an exemplary embodiment, silicon region 1320 is formed from silicon layer 1320a over a side of PFET dielectric layer 1318 opposite substrate 1306, and silicon layer 1320b over a side of silicon layer 1320a opposite PFET dielectric layer 1318 (with interface 1322 defined between silicon layers 1320a and 1320b), wherein silicon layer 1320a comprises either polysilicon or amorphous silicon, and silicon layer 1320b similarly comprises either polysilicon or amorphous silicon.

Figure 13:
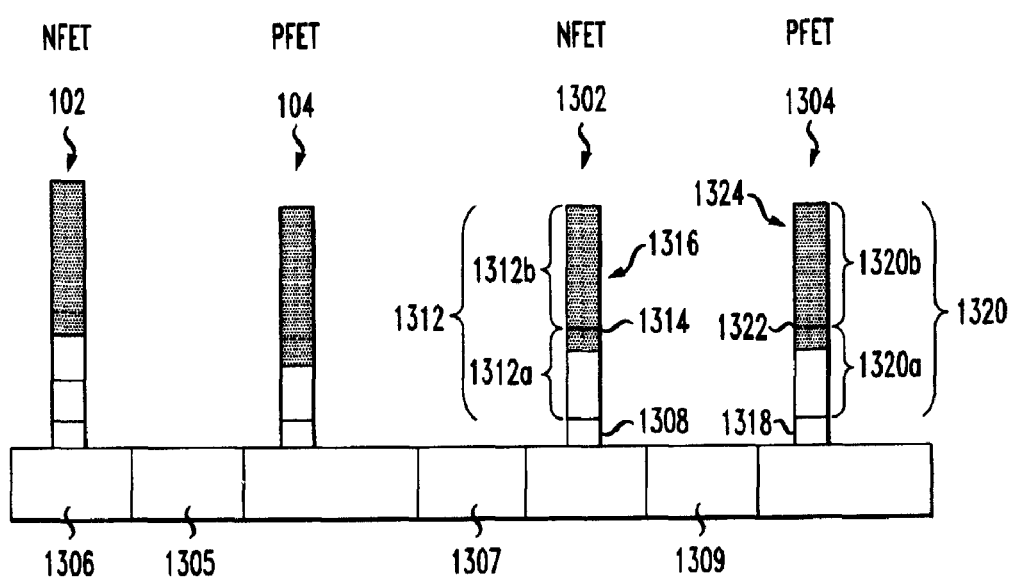
FIG. 13 is a diagram illustrating an exemplary partially silicided metal NFET gate stack and an exemplary partially silicided PFET gate stack integrated with an exemplary partially silicided NFET gate stack and an exemplary partially silicided PFET gate stack on a common substrate according to an embodiment of the present invention.

Silicon region 1320 is partially silicided, such that a silicide region 1324 is formed that entirely consumes silicon layer 1320b and a portion of silicon layer 1320a. Alternatively, the entire silicon region can be silicided. When the silicon region is partially silicided, the non-silicided portion of the silicon region (i.e., shown in FIG. 13 as the region of silicon layer 1320a below silicide region 1324) can be doped. Suitable dopants include, but are not limited to B or $BF_2$. Suitable metals for use in forming silicide region 1324, include, but are not limited to, one or more of Ni and Co. NFET gate stack 1302 and PFET gate stack 1304 can be used to form an NFET and PFET, respectively, that in the completed planar MOS device can serve as device input/output transistors. Further, the configuration shown in FIG. 13 is merely exemplary and any of the other gate stack configurations described above can be used in conjunction with gate stacks 1302 and 1304.

Figure 14A:
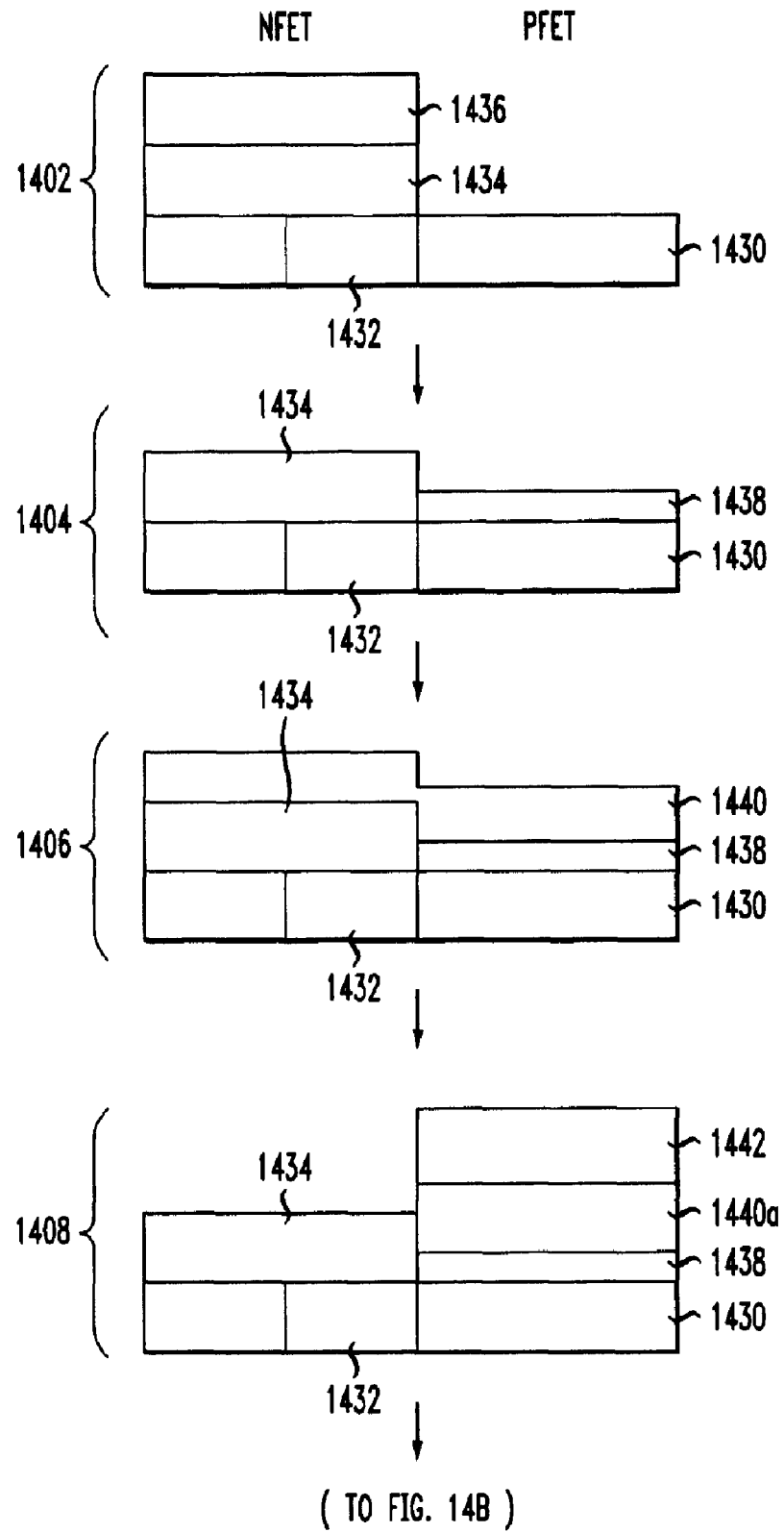
FIGS. 14A-C are diagrams illustrating an exemplary methodology for fabricating a silicided metal NFET gate stack and a silicided PFET gate stack on a common substrate according to an embodiment of the present invention.
Figure 14B:
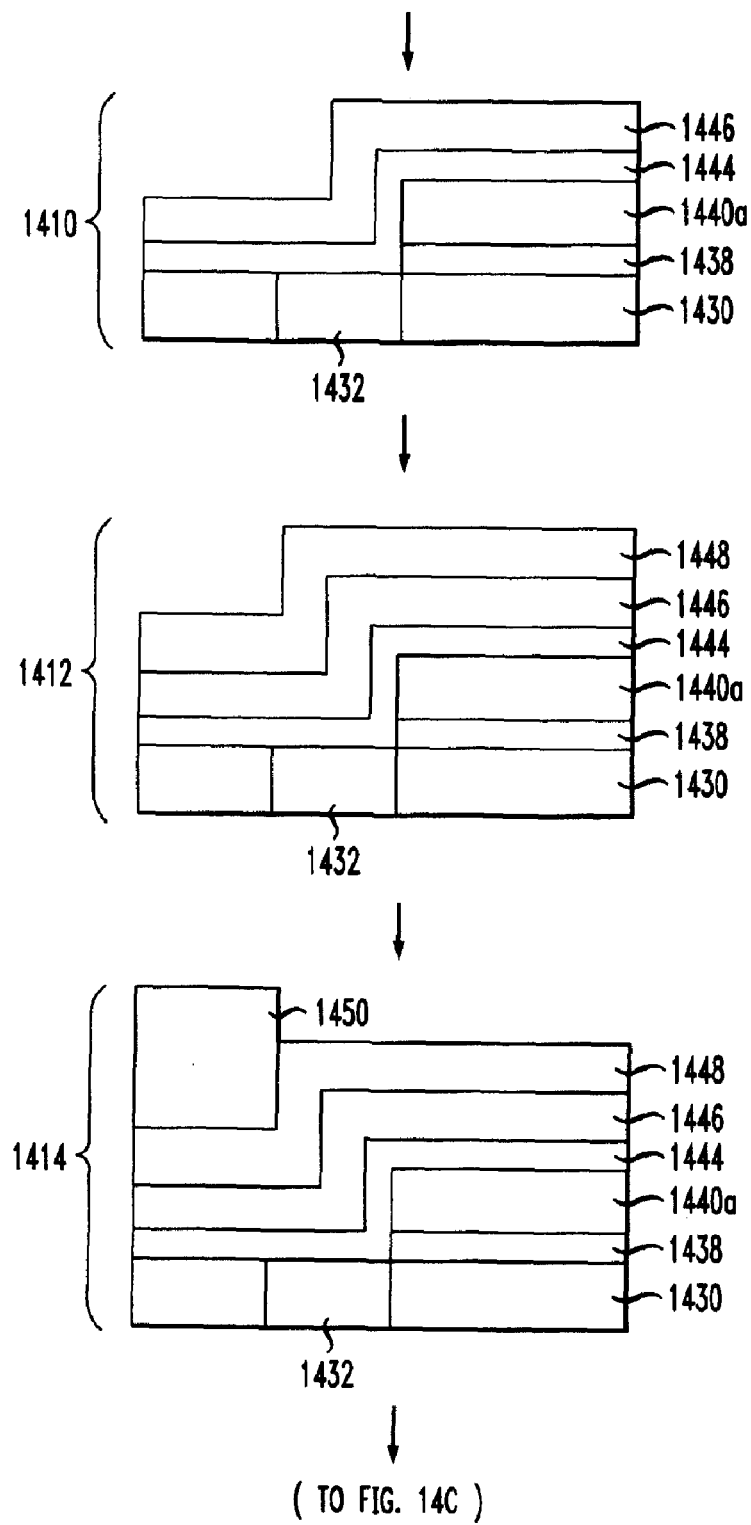
Figure 14C:
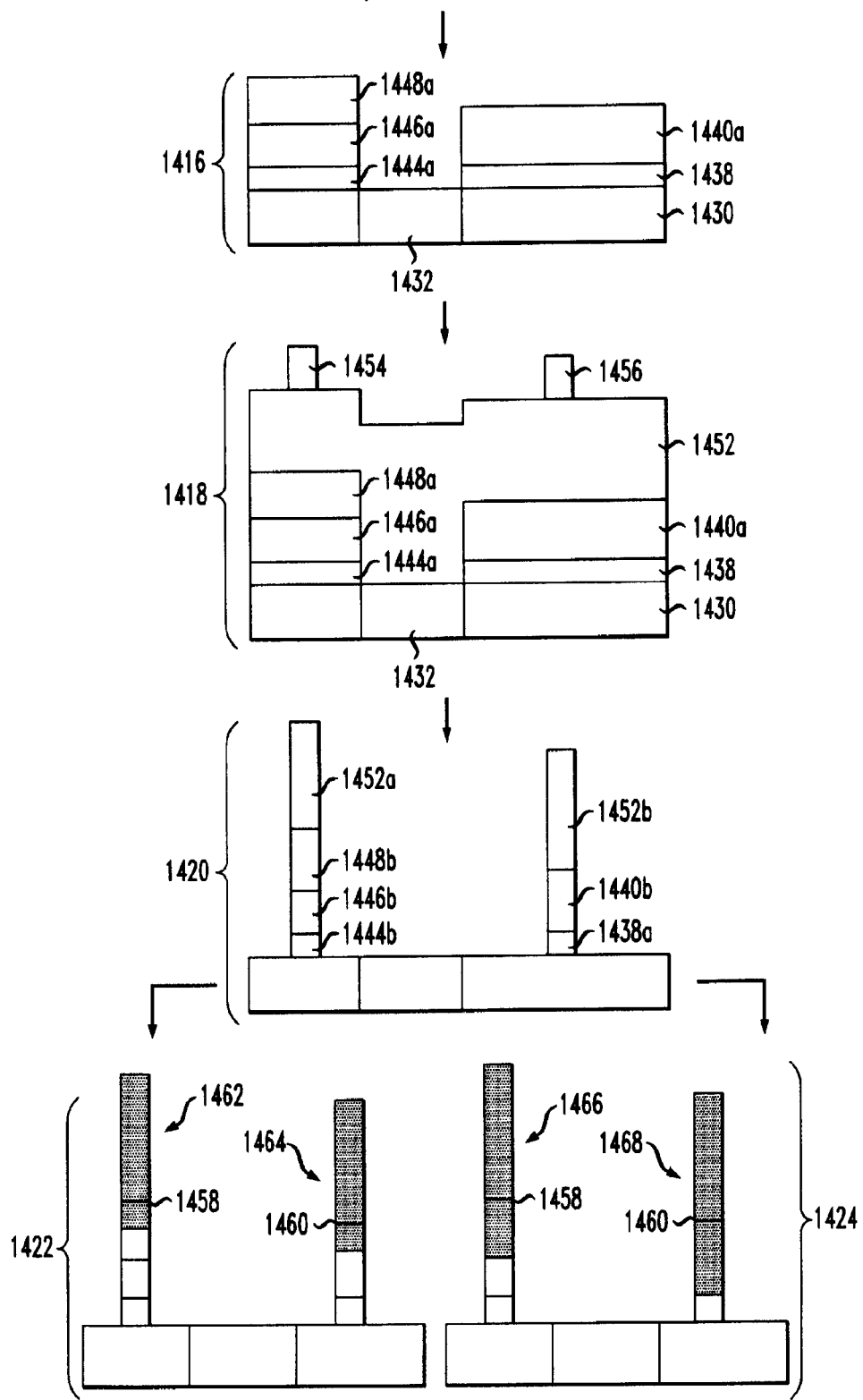

FIGS. 14A-C are diagrams illustrating exemplary methodology 1400 for fabricating an NFET gate stack and a PFET gate stack on a common substrate. Methodology 1400 may be used to fabricate partially silicided NFET gate stack 102 and partially silicided PFET gate stack 104, described, for example, in conjunction with the description of FIG. 1, above and/or fully silicided NFET gate stack 202 and fully silicided PFET gate stack 204, described, for example, in conjunction with the description of FIG. 2, above.

According to methodology 1400, the fabrication begins by first forming the PFET dielectric. Namely, in step 1402, substrate 1430 is provided. According to an exemplary embodiment, substrate 1430 comprises a SOI substrate. A STI region, i.e., STI region 1432, is then formed in substrate 1430.

As will be described below, STI region 1432 will divide the NFET gate stack from the PFET gate stack on substrate 1430. Thus, to facilitate the following description of the fabrication process, a region of substrate 1430 to the left of STI region 1432, on which the NFET gate stack is formed, will be referred to hereinafter as a NFET region of substrate 1430, and a region of substrate 1430 to the right of STI region 1432, on which the PFET gate stack is formed, will be referred to hereinafter as a PFET region of substrate 1430. Similarly, any component, structure, layer and/or portion(s) thereof located on substrate 1430 to the left of STI region 1432, from which the NFET gate stack is formed, will be referred to hereinafter as a NFET region of that component, structure, layer and/or portion(s) thereof, and any component, structure, layer and/or portion(s) thereof located on substrate 1430 to the right of STI region 1432, from which the PFET gate stack is formed, will be referred to hereinafter as a PFET region of that component, structure, layer and/or portion(s) thereof. The designation of "left" and "right" of STI region 1432 is done solely for illustrative purposes and for ease and clarity of description based on the exemplary orientation shown in FIG. 14, and should by no means be construed as a required orientation of the gate stacks.

Oxide layer 1434 is then deposited over substrate 1430. According to an exemplary embodiment, oxide layer 1434 comprises silicon dioxide ($SiO_2$) and is deposited over substrate 1430 using one or more of chemical vapor deposition (CVD), low pressure chemical vapor deposition (LPCVD) and plasma-enhanced chemical vapor deposition (PECVD), to a thickness of between about 2.3 nm and about five nm.

Oxide layer 1434 is selectively removed from the PFET region of substrate 1430. According to an exemplary embodiment, photoresist 1436 is first formed over oxide layer 1434 as a mask, and reactive ion etching (RIE), or any other suitable etching process, is then used to selectively remove oxide layer 1434 from the PFET region of substrate 1430.

In step 1404, PFET dielectric material layer 1438 is deposited over the PFET region of substrate 1430. According to an exemplary embodiment, PFET dielectric material layer 1438 comprises an oxynitride, such as silicon oxynitride (as described above) and is deposited over substrate 1430 using one or more of PECVD, rapid thermal process (RTP) deposition and thermal oxidation to a thickness of between about one nm and about three nm.

In step 1406, silicon material layer 1440 is deposited over oxide layer 1434/PFET dielectric material layer 1438. Silicon material layer 1440 will be used to form a first of two silicon layers of the PFET gate stack. According to an exemplary embodiment, silicon material layer 1440 comprises either polysilicon or amorphous silicon (as described above) and is deposited over oxide layer 1434/PFET dielectric material layer 1438 using one or more of CVD, LPCVD and PECVD, to a thickness of up to about 20 nm.

In step 1408, silicon material layer 1440 is selectively removed from oxide layer 1434. Namely, photoresist 1442 is first formed over a PFET region of silicon material layer 1440 as a mask. RIE, or any other suitable etching process, is then used to selectively remove silicon material layer 1440 from oxide layer 1434, thus forming silicon material layer 1440a.

In step 1410, NFET dielectric material layer 1444 is deposited over substrate 1430/silicon material layer 1440a. According to an exemplary embodiment, NFET dielectric material layer 1444 comprises one or more of $HfO_2$, $Ta_2O_5$, $TiO_2$, $Al_2O_3$ and $La_2O_5$ (as described above) and is deposited over substrate 1430/silicon material layer 1440a using one or more of CVD, LPCVD and PECVD, to a thickness of between about one nm and about four nm. Metal gate material layer 1446 is then deposited over NFET dielectric material layer 1444. According to an exemplary embodiment, metal gate material layer 1446 comprises one or more of Ta, TaN, TaCN, TaSiN, TaSi, AlN, W and Mo (as described above) and is deposited over NFET dielectric material layer 1444 using one or more of PECVD and atomic layer deposition (ALD), to a thickness of about 10 nm.

In step 1412, silicon material layer 1448 is deposited over metal gate material layer 1446. Silicon material layer 1448 will be used to form a first of two silicon layers of the NFET gate stack. According to an exemplary embodiment, silicon material layer 1448 comprises either polysilicon or amorphous silicon (as described above) and is deposited over metal gate material layer 1446 using one or more of CVD, LPCVD and PECVD, to a thickness of up to about 20 nm.

In step 1414 photoresist 1450 is formed over an NFET region of silicon layer 1448 as a mask. In step 1416, RIE, or any other suitable etching process and/or combination of etching processes, is used to selectively remove portions of NFET dielectric material layer 1444, metal gate material layer 1446 and silicon material layer 1448 not masked by photoresist 1450.

According to an exemplary embodiment, NFET dielectric material layer 1444 comprises $HfO_2$, metal gate material layer 1446 comprises TaN and silicon material layer 1448 comprises amorphous silicon, and step 1416 is accomplished using a multi-stage etching process. Namely, portions of silicon material layer 1448 not masked by photoresist 1450 are first removed, e.g., by RIE, with metal gate material layer 1446 acting as an etch stop. Nitride-selective RIE is then used to remove portions of metal gate material layer 1446 not masked by photoresist 1450, with NFET dielectric material layer 1444 acting as an etch stop. Finally, oxide-selective RIE is used to remove portions of NFET dielectric material layer 1444 not masked by photoresist 1450. The etching of NFET dielectric material layer 1444, metal gate material layer 1446 and silicon material layer 1448 results in the formation of NFET dielectric material layer 1444a, metal gate material layer 1446a and silicon material layer 1448a, respectively, over the NFET region of the substrate.

In step 1418, silicon material layer 1452 is deposited over STI region 1432/silicon material layers 1440a and 1448a. According to an exemplary embodiment, silicon material layer 1452 comprises either polysilicon or amorphous silicon (as described above) and is conformally deposited over STI region 1432/silicon material layers 1440a and 1448a using one or more of LPCVD and rapid thermal chemical vapor deposition (RTCVD), to a uniform thickness of between about 50 nm and about 80 nm. Silicon material layer 1452 will be used to form a second silicon layer in both the NFET and PFET gate stacks.

Photoresist 1454 and photoresist 1456 are then formed over silicon layer 1452 as masks. Photoresist 1454 and photoresist 1456 will determine the footprints and locations of the NFET and PFET gate stacks, respectively.

In step 1420, each of the NFET and PFET gate stacks are defined. According to an exemplary embodiment, the gate stacks are defined by etching the gate stack layers, e.g., using RIE, or any other suitable etching process, with the photoresist 1454 and photoresist 1456 (formed in step 1418, above) as masks. Namely, to define the NFET gate stack, an etch is performed through silicon material layer 1452/silicon material layer 1448a/metal gate material layer 1446a/NFET dielectric material layer 1444a to form silicon layer 1452a/silicon layer 1448b/metal gate layer 1446b/NFET dielectric material layer 1444b, respectively. To define the PFET gate stack, an etch is performed through silicon material layer 1452/silicon material layer 1440a/PFET dielectric material layer 1438 to form silicon layer 1452b/silicon layer 1440b/PFET dielectric layer 1438a, respectively.

One or more dopants may be introduced into the silicon layers (as described above), i.e., by any suitable implantation process, prior to sillicidation (see below). By way of example only, an n-type dopant can be introduced into silicon layer 1452a/silicon layer 1448b and a p-type dopant can be introduced into silicon layer 1452b/silicon layer 1440b. As described above, however, a dopant is not needed for those gate stacks that will be fully sillicided (see, for example, step 1424, below).

The NFET and PFET gate stacks, defined in step 1420 above, are then either partially or fully sillicided, as in steps 1422 or 1424, respectively. Namely, in step 1422, a first silicide metal layer comprising, e.g., one or more of Ni and Co (as described above), is deposited over the NFET gate stack and a second silicide metal layer comprising, e.g., one or more of Ni and Co (as described above), is deposited over the PFET gate stack. According to an exemplary embodiment, the first silicide metal layer and the second silicide metal layer have the same composition as each other. Alternatively, the first silicide metal layer can have a composition that is different from a composition of the second silicide metal layer. In that instance, a sequence of annealing steps (described below) would be performed. By way of example only, the silicide that is formed at a higher annealing temperature (e.g., cobalt silicide $CoSi_2$) would be formed first, followed by the silicide that is formed at a lower annealing temperature (e.g., nickel silicide $NiSi_2$).

A thickness of the first silicide metal layer is configured such that, upon annealing (described below), a silicide is formed that completely consumes silicon layer 1452a and a portion of silicon layer 1448b, so as to transcend the interface, i.e., interface 1458, between silicon layer 1452a and silicon layer 1448b. Similarly, a thickness of the second silicide metal layer is configured such that, upon annealing (described below), a silicide is formed that completely consumes silicon layer 1452b and a portion of silicon layer 1440b, so as to transcend the interface, i.e., interface 1460, between silicon layer 1452b and silicon layer 1440b. As described above, silicidation past the interface of the silicon layers in the gate stack eliminates the interface issues.

As such, the thickness of the first/second silicide metal layers will depend, at least in part, on a thickness of silicon layer 1452a/silicon layer 1452b, respectively. Therefore, since silicon layer 1452b has about the same thickness as silicon layer 1452a, the first and second silicide metal layers also have about the same thickness as one another.

The NFET and PFET gate stacks are then annealed to form silicide regions 1462 and 1464, respectively. According to an exemplary embodiment, the NFET and PFET gate stacks are annealed at a temperature of between about 400 degrees Celsius (° C.) and about 600° C. As such, partially silicided NFET and PFET gates stacks are formed.

Alternatively, in step 1424, a first silicide metal layer comprising, e.g., one or more of Ni and Co (as described above), is deposited over the NFET gate stack and a second silicide metal layer comprising, e.g., one or more of Ni and Co (as described above), is deposited over the PFET gate stack. A thickness of the first silicide metal layer is configured such that, upon annealing (described below), a silicide is formed that completely consumes both silicon layer 1452a and silicon layer 1448b, transcending the interface, i.e., interface 1458, between silicon layer 1452a and silicon layer 1448b. Similarly, a thickness of the second silicide metal layer is configured such that, upon annealing (described below), a silicide is formed that completely consumes silicon layer 1452b and silicon layer 1440b, transcending the interface, i.e., interface 1460, between silicon layer 1452b and silicon layer 1440b. As described above, silicidation past the interface of the silicon layers in the gate stack eliminates the interface issues.

As such, the thickness of the first and second silicide metal layers will depend, at least in part, on a thickness of silicon layer 1452a/silicon layer 1448b and silicon layer 1452b/silicon layer 1440b, respectively. Therefore, since a combined thickness of silicon layer 1452b and silicon layer 1440b is about the same as a combined thickness of silicon layer 1452a and silicon layer 1448b, the first and second silicide metal layers also have about the same thickness as one another.

The NFET and PFET gate stacks are then annealed to form silicide regions 1466 and 1468, respectively. As such, fully silicided NFET and PFET gates stacks are formed.

Figure 15A:
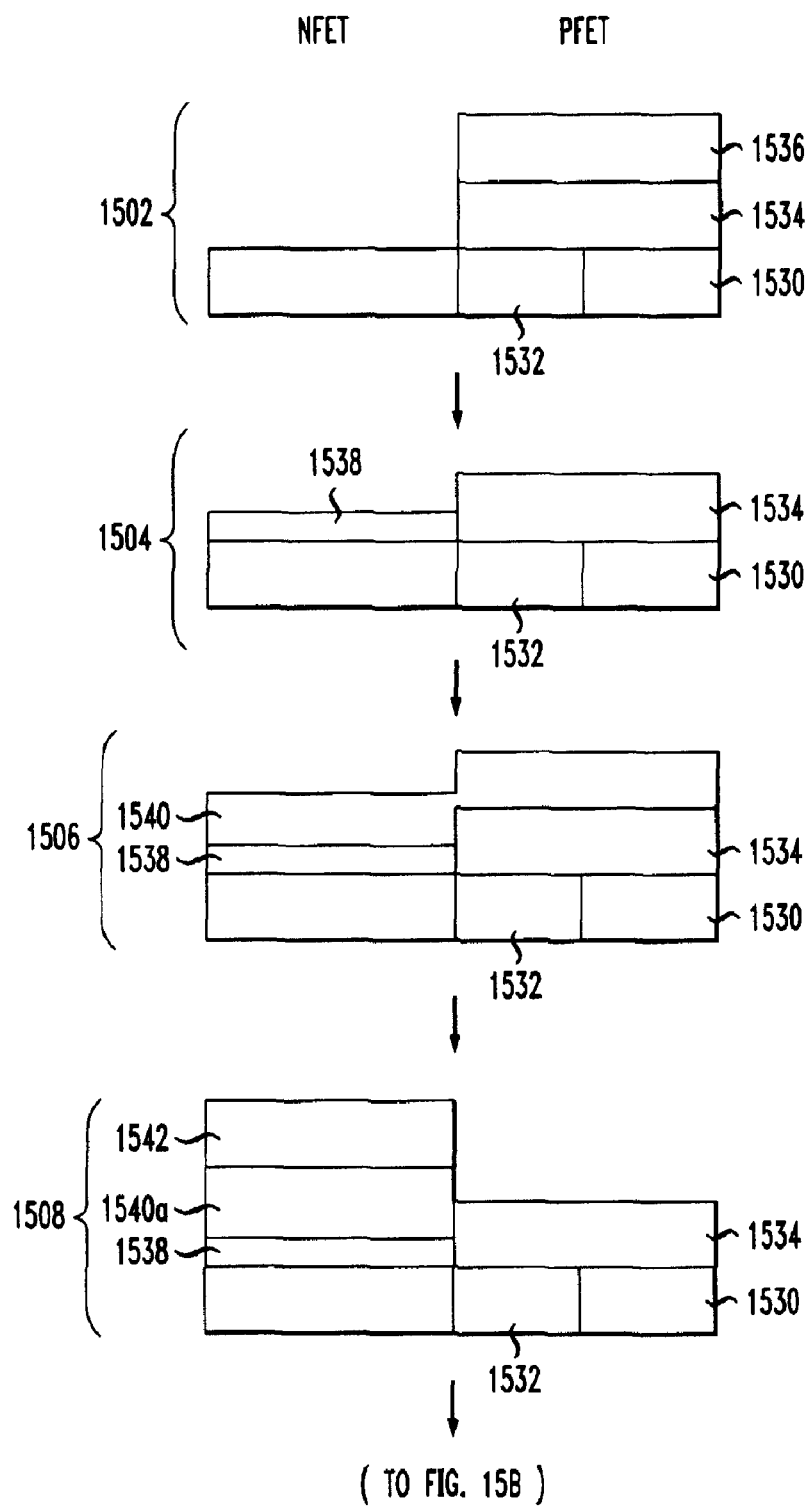
FIGS. 15A-C are diagrams illustrating an exemplary methodology for fabricating a silicided NFET gate stack and a silicided metal PFET gate stack on a common substrate according to an embodiment of the present invention.
Figure 15B:
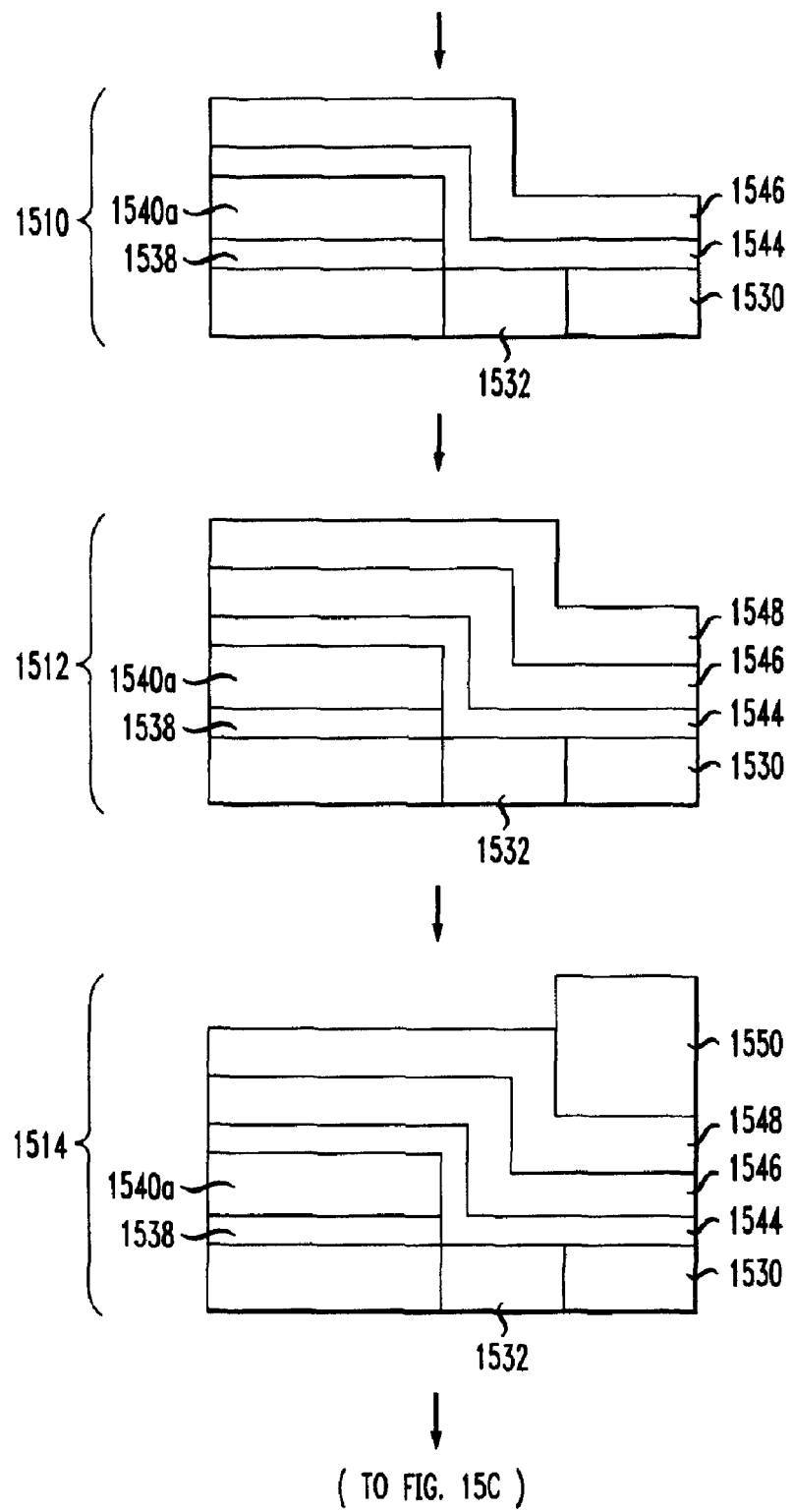
Figure 15C:
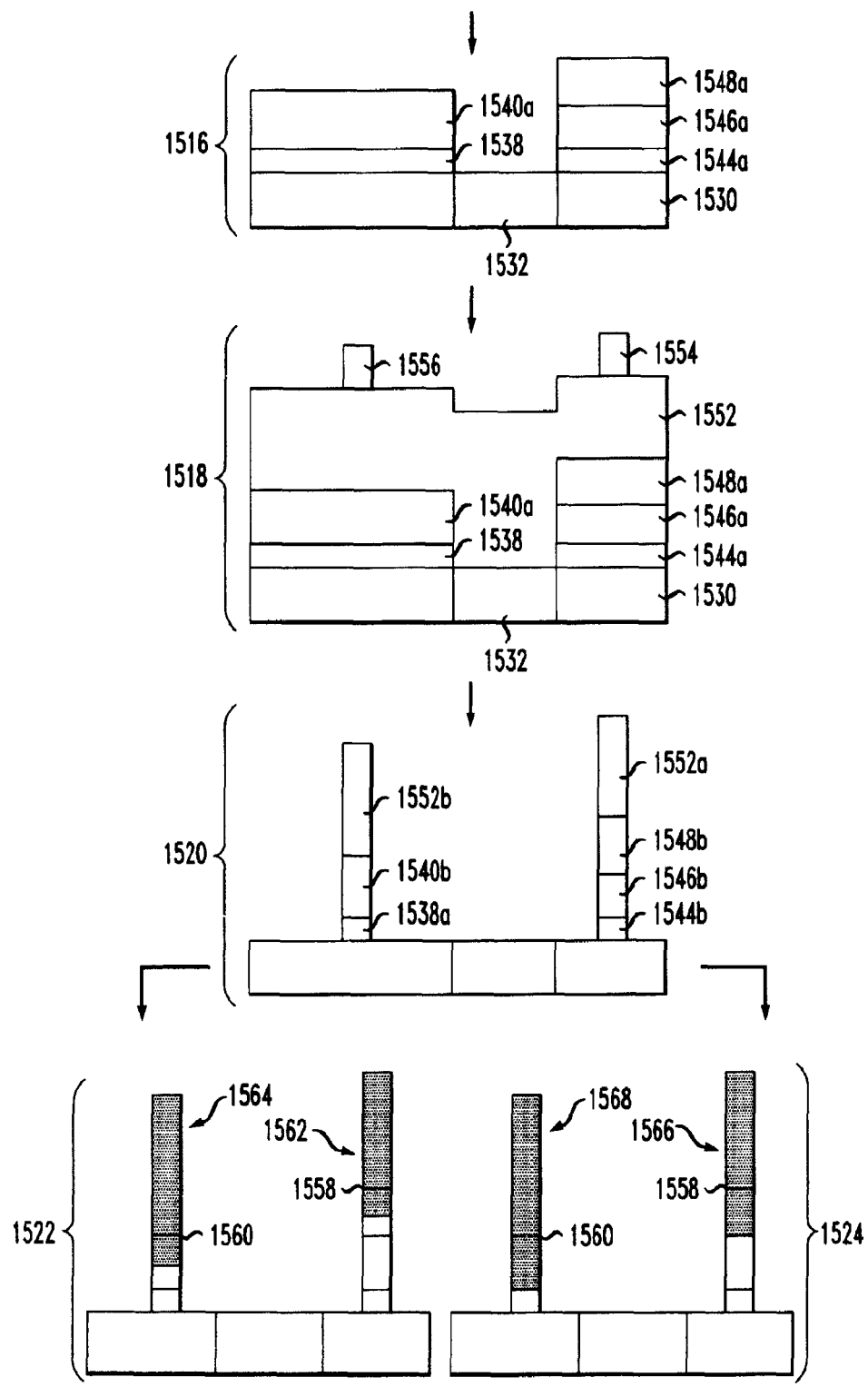

FIGS. 15A-C are diagrams illustrating exemplary methodology 1500 for fabricating an NFET gate stack and a PFET gate stack on a common substrate. Methodology 1500 may be used to fabricate partially silicided NFET gate stack 502 and partially silicided PFET gate stack 504, described, for example, in conjunction with the description of FIG. 5, above and/or fully silicided NFET gate stack 602 and fully silicided PFET gate stack 604, described, for example, in conjunction with the description of FIG. 6, above.

According to methodology 1500, the fabrication begins by first forming the NFET dielectric. Namely, in step 1502, substrate 1530 is provided. According to an exemplary embodiment, substrate 1530 comprises a SOI substrate. A STI region, i.e., STI region 1532, is then formed in substrate 1530.

As will be described below, STI region 1532 will divide the NFET gate stack from the PFET gate stack on substrate 1530. Thus, to facilitate the following description of the fabrication process, a region of substrate 1530 to the left of STI region

1532, on which the NFET gate stack is formed, will be referred to hereinafter as a NFET region of substrate 1530, and a region of substrate 1530 to the right of STI region 1532, on which the PFET gate stack is formed, will be referred to hereinafter as a PFET region of substrate 1530. Similarly, any component, structure, layer and/or portion(s) thereof located on substrate 1530 to the left of STI region 1532, from which the NFET gate stack is formed, will be referred to hereinafter as a NFET region of that component, structure, layer and/or portion(s) thereof, and any component, structure, layer and/or portion(s) thereof located on substrate 1530 to the right of STI region 1532, from which the PFET gate stack is formed, will be referred to hereinafter as a PFET region of that component, structure, layer and/or portion(s) thereof. The designation of "left" and "right" of STI region 1532 is done solely for illustrative purposes and for ease and clarity of description based on the exemplary orientation shown in FIG. 15, and should by no means be construed as a required orientation of the gate stacks.

Oxide layer 1534 is then deposited over substrate 1530. According to an exemplary embodiment, oxide layer 1534 comprises $SiO_2$ and is deposited over substrate 1530 using one or more of CVD, LPCVD and PECVD, to a thickness of between about 2.3 nm and about five nm.

Oxide layer 1534 is selectively removed from the NFET region of substrate 1530. According to an exemplary embodiment, photoresist 1536 is first formed over oxide layer 1534 as a mask, and RIE, or any other suitable etching process, is then used to selectively remove oxide layer 1534 from the NFET region of substrate 1530.

In step 1504, NFET dielectric material layer 1538 is deposited over the NFET region of substrate 1530. According to an exemplary embodiment, NFET dielectric material layer 1538 comprises an oxynitride, such as silicon oxynitride (as described above) and is deposited over substrate 1530 using one or more of PECVD, RTP deposition and thermal oxidation to a thickness of between about one nm and about three nm.

In step 1506, silicon material layer 1540 is deposited over NFET dielectric material layer 1538/oxide layer 1534. Silicon material layer 1540 will be used to form a first of two silicon layers of the NFET gate stack. According to an exemplary embodiment, silicon material layer 1540 comprises either polysilicon or amorphous silicon (as described above) and is deposited over NFET dielectric material layer 1538/oxide layer 1534 using one or more of CVD, LPCVD and PECVD, to a thickness of up to about 20 nm.

In step 1508, silicon material layer 1540 is selectively removed from oxide layer 1534. Namely, photoresist 1542 is first formed over a NFET region of silicon material layer 1540 as a mask. RIE, or any other suitable etching process, is then use to selectively remove silicon material layer 1540 from oxide layer 1534, thus forming silicon material layer 1540a.

In step 1510, PFET dielectric material layer 1544 is deposited over silicon material layer 1540a/substrate 1530. According to an exemplary embodiment, PFET dielectric material layer 1544 comprises one or more of $HfO_2$, $Ta_2O_5$, $TiO_2$, $Al_2O_3$ and $La_2O_5$ (as described above) and is deposited over silicon material layer 1540a/substrate 1530 using one or more of CVD, LPCVD and PECVD, to a thickness of between about one nm and about four nm. Metal gate material layer 1546 is then deposited over PFET dielectric material layer 1544. According to an exemplary embodiment, metal gate material layer 1546 comprises one or more of Ta, TaN, TaCN, TaSiN, TaSi, MN, W and Mo (as described above) and is deposited over PFET dielectric material layer 1544 using one or more of PECVD and ALD, to a thickness of about 10 nm.

In step 1512, silicon material layer 1548 is deposited over metal gate material layer 1546. Silicon material layer 1548 will be used to form a first of two silicon layers of the PFET gate stack. According to an exemplary embodiment, silicon material layer 1548 comprises either polysilicon or amorphous silicon (as described above) and is deposited over metal gate material layer 1546 using one or more of CVD, LPCVD and PECVD, to a thickness of up to about 20 nm.

In step 1514 photoresist 1550 is formed over a PFET region of silicon material layer 1548 as a mask. In step 1516, RIE, or any other suitable etching process and/or combination of etching processes, is used to selectively remove portions of PFET dielectric material layer 1544, metal gate material layer 1546 and silicon material layer 1548 not masked by photoresist 1550.

According to an exemplary embodiment, PFET dielectric material layer 1544 comprises $HfO_2$, metal gate material layer 1546 comprises TaN and silicon material layer 1548 comprises amorphous silicon, and step 1516 is accomplished using a multi-stage etching process. Namely, portions of silicon material layer 1548 not masked by photoresist 1550 are first removed, e.g., by RIE, with metal gate material layer 1546 acting as an etch stop. Nitride-selective RIE is then used to remove portions of metal gate material layer 1546 not masked by photoresist 1550, with PFET dielectric material layer 1544 acting as an etch stop. Finally, oxide-selective RIE is used to remove portions of PFET dielectric material layer 1544 not masked by photoresist 1550. The etching of PFET dielectric material layer 1544, metal gate material layer 1546 and silicon material layer 1548 results in the formation of PFET dielectric material layer 1544a, metal gate material layer 1546a and silicon material layer 1548a, respectively, over the PFET region of the substrate.

In step 1518, silicon material layer 1552 is deposited over STI region 1532/silicon material layers 1540a and 1548a. According to an exemplary embodiment, silicon material layer 1552 comprises either polysilicon or amorphous silicon (as described above) and is conformally deposited over STI region 1532/silicon material layers 1540a and 1548a using one or more of LPCVD and RTCVD, to a uniform thickness of between about 50 nm and about 80 nm. Silicon material layer 1552 will be used to form a second silicon layer in both the NFET and PFET gate stacks.

Photoresist 1556 and photoresist 1554 are then formed over silicon material layer 1552 as masks. Photoresist 1556 and photoresist 1554 will determine the footprints and locations of the NFET and PFET gate stacks, respectively.

In step 1520, each of the NFET and PFET gate stacks are defined. According to an exemplary embodiment, the gate stacks are defined by etching the gate stack layers, e.g., using RIE, or any other suitable etching process, with the photoresist 1556 and photoresist 1554 (formed in step 1518, above) as masks. Namely, to define the NFET gate stack, an etch is performed through silicon material layer 1552/silicon material layer 1540a/NFET dielectric material layer 1538 to form silicon layer 1552b/silicon layer 1540b/NFET dielectric layer 1538a, respectively. To define the PFET gate stack, an etch is performed through silicon material layer 1552/silicon material layer 1548a/metal gate material layer 1546a/PFET dielectric material layer 1544a to form silicon layer 1552a/silicon layer 1548b/metal gate layer 1546b/PFET dielectric layer 1544b, respectively.

One or more dopants may be introduced into the silicon layers (as described above), i.e., by any suitable implantation process, prior to sillicidation (see below). By way of example only, an n-type dopant can be introduced into silicon layer 1552b/silicon layer 1540b and a p-type dopant can be introduced into silicon layer 1552a/silicon layer 1548b. As described above, however, a dopant is not needed for those gate stacks that will be fully sillicided (see, for example, step 1524, below).

The NFET and PFET gate stacks, defined in step 1520 above, are then either partially or fully sillicided, as in steps 1522 or 1524, respectively. Namely, in step 1522, a first silicide metal layer comprising, e.g., one or more of Ni and Co (as described above), is deposited over the NFET gate stack and a second silicide metal layer comprising, e.g., one or more of Ni and Co (as described above), is deposited over the PFET gate stack. According to an exemplary embodiment, the first silicide metal layer and the second silicide metal layer have the same composition as each other. Alternatively, the first silicide metal layer can have a composition that is different from a composition of the second silicide metal layer. In that instance, a sequence of annealing steps (described below) would be performed. By way of example only, the silicide that is formed at a higher annealing temperature (e.g., cobalt silicide $CoSi_2$) would be formed first, followed by the silicide that is formed at a lower annealing temperature (e.g., nickel silicide $NiSi_2$).

A thickness of the first silicide metal layer is configured such that, upon annealing (described below), a silicide is formed that completely consumes silicon layer 1552b and a portion of silicon layer 1540b, so as to transcend the interface, i.e., interface 1560, between silicon layer 1552b and silicon layer 1540b. Similarly, a thickness of the second silicide metal layer is configured such that, upon annealing (described below), a silicide is formed that completely consumes silicon layer 1552a and a portion of silicon layer 1548b, so as to transcend the interface, i.e., interface 1558, between silicon layer 1552a and silicon layer 1548b. As described above, silicidation past the interface of the silicon layers in the gate stack eliminates the interface issues.

As such, the thickness of the first/second silicide metal layers will depend, at least in part, on a thickness of silicon layer 1552b/silicon layer 1552a, respectively. Therefore, since silicon layer 1552b has about the same thickness as silicon layer 1552a, the first and second silicide metal layers will have about the same thickness as one another.

The NFET and PFET gate stacks are then annealed to form silicide regions 1564 and 1562, respectively. According to an exemplary embodiment, the NFET and PFET gate stacks are annealed at a temperature of between about 400° C. and about 600° C. As such, partially silicided NFET and PFET gates stacks are formed.

Alternatively, in step 1524, a first silicide metal layer comprising, e.g., one or more of Ni and Co (as described above), is deposited over the NFET gate stack and a second silicide metal layer comprising, e.g., one or more of Ni and Co (as described above), is deposited over the PFET gate stack. A thickness of the first silicide metal layer is configured such that, upon annealing (described below), a silicide is formed that completely consumes both silicon layer 1552b and silicon layer 1540b, transcending the interface, i.e., interface 1560, between silicon layer 1552b and silicon layer 1540b. Similarly, a thickness of the second silicide metal layer is configured such that, upon annealing (described below), a silicide is formed that completely consumes silicon layer 1552a and silicon layer 1548b, transcending the interface, i.e., interface 1558, between silicon layer 1552a and silicon layer 1548b. As described above, silicidation past the interface of the silicon layers in the gate stack eliminates the interface issues.

As such, the thickness of the first and second silicide metal layers will depend, at least in part, on a thickness of silicon layer 1552b/silicon layer 1540b and silicon layer 1552a/silicon layer 1548b, respectively. Therefore, since a combined thickness of silicon layer 1552b and silicon layer 1540b is about the same as a combined thickness of silicon layer 1552a and silicon layer 1548b, the first and second silicide metal layers also have about the same thickness as one another.

The NFET and PFET gate stacks are then annealed to form silicide regions 1568 and 1566, respectively. As such, fully silicided NFET and PFET gates stacks are formed.

Figure 16A:
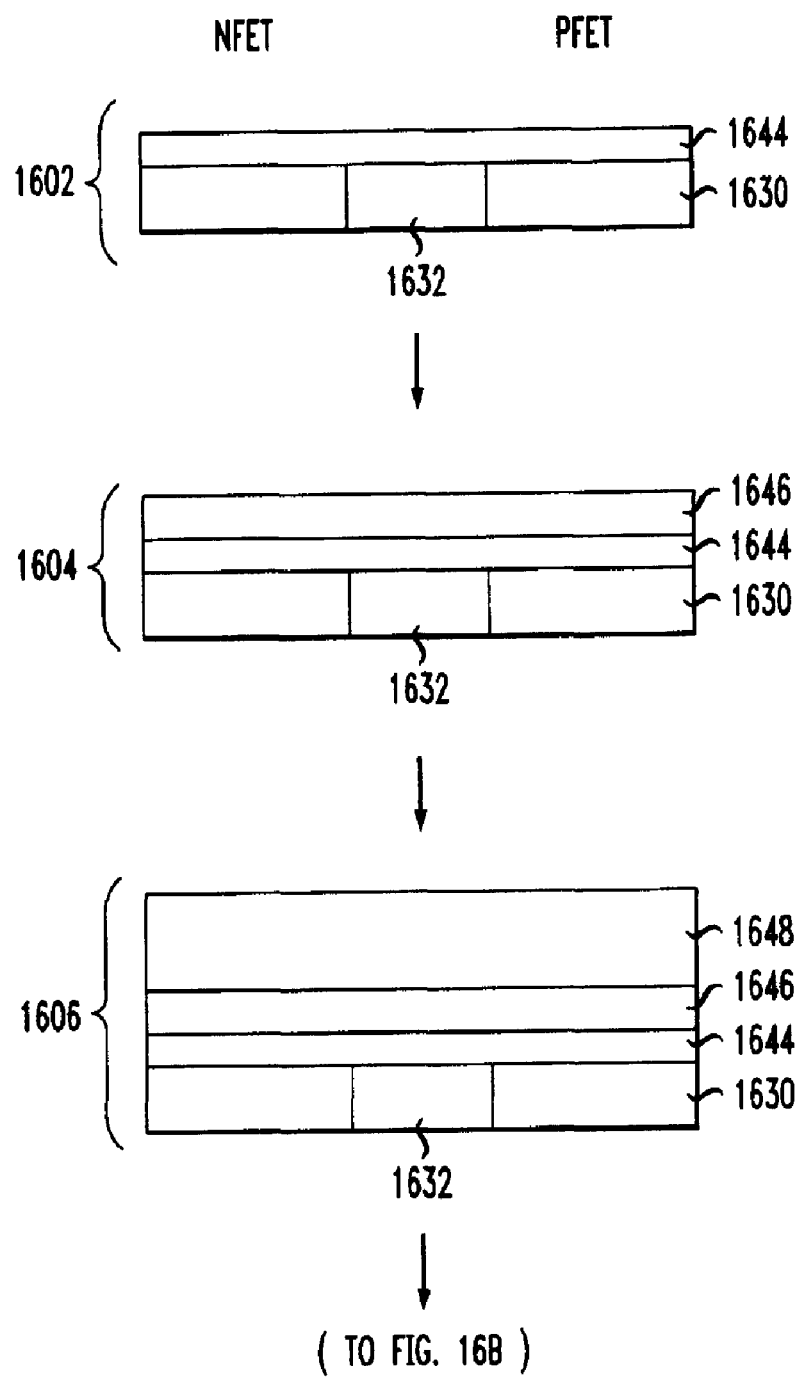

FIGS. 16A-C are diagrams illustrating exemplary methodology 1600 for fabricating an NFET gate stack and a PFET gate stack on a common substrate. Methodology 1600 may be used to fabricate partially silicided NFET gate stack 902 and partially silicided PFET gate stack 904, described, for example, in conjunction with the description of FIG. 9, above and/or fully silicided NFET gate stack 1002 and fully silicided PFET gate stack 1004, described, for example, in conjunction with the description of FIG. 10, above.

In step 1602, substrate 1630 is provided. According to an exemplary embodiment, substrate 1630 comprises a SOI substrate. A STI region, i.e., STI region 1632, is then formed in substrate 1630.

As will be described below, STI region 1632 will divide the NFET gate stack from the PFET gate stack on substrate 1630. Thus, to facilitate the following description of the fabrication process, a region of substrate 1630 to the left of STI region 1632, on which the NFET gate stack is formed, will be referred to hereinafter as a NFET region of substrate 1630, and a region of substrate 1630 to the right of STI region 1632, on which the PFET gate stack is formed, will be referred to hereinafter as a PFET region of substrate 1630. Similarly, any component, structure, layer and/or portion(s) thereof located on substrate 1630 to the left of STI region 1632, from which the NFET gate stack is formed, will be referred to hereinafter as a NFET region of that component, structure, layer and/or portion(s) thereof, and any component, structure, layer and/or portion(s) thereof located on substrate 1630 to the right of STI region 1632, from which the PFET gate stack is formed, will be referred to hereinafter as a PFET region of that component, structure, layer and/or portion(s) thereof. The designation of "left" and "right" of STI region 1632 is done solely for illustrative purposes and for ease and clarity of description based on the exemplary orientation shown in FIG. 16, and should by no means be construed as a required orientation of the gate stacks.

Dielectric material layer 1644 is deposited over substrate 1630. According to an exemplary embodiment, dielectric material layer 1644 comprises one or more of $HfO_2$, $Ta_2O_5$, $TiO_2$, $Al_2O_3$ and $La_2O_5$ (as described above) and is deposited over substrate 1630 using one or more of CVD, LPCVD and PECVD, to a thickness of between about one nm and about four nm.

In step 1604, metal gate material layer 1646 is then deposited over dielectric material layer 1644. According to an exemplary embodiment, metal gate material layer 1646 comprises one or more of Ta, TaN, TaCN, TaSiN, TaSi, AlN, W and Mo (as described above) and is deposited over dielectric material layer 1644 using one or more of PECVD and ALD, to a thickness of about 10 nm.

In step 1606, silicon material layer 1648 is deposited over metal gate material layer 1646. Silicon material layer 1648 will be used to form a first of two silicon layers of the NFET/

PFET gate stacks. According to an exemplary embodiment, silicon material layer 1648 comprises either polysilicon or amorphous silicon (as described above) and is deposited over metal gate material layer 1646 using one or more of CVD, LPCVD and PECVD, to a thickness of up to about 20 nm.

In step 1608, silicon material layer 1652 is deposited over silicon material layer 1648. Silicon material layer 1652 will be used to form a second of two silicon layers of the NFET/PFET gate stacks. According to an exemplary embodiment, silicon material layer 1652 comprises either polysilicon or amorphous silicon (as described above) and is deposited over silicon material layer 1648 using one or more of CVD, LPCVD and PECVD, to a thickness of between about 50 nm and about 80 nm.

In step 1610, photoresist 1654 and photoresist 1656 are then formed over silicon material layer 1652 as masks. Photoresist 1654 and photoresist 1656 will determine the footprints and locations of the NFET and PFET gate stacks, respectively.

In step 1612, each of the NFET and PFET gate stacks are defined. According to an exemplary embodiment, the gate stacks are defined by etching the gate stack layers, e.g., using RIE, or any other suitable etching process, with the photoresist 1654 and photoresist 1656 (formed in step 1610, above) as masks. Namely, to define the NFET gate stack, an etch is performed through silicon material layer 1652/silicon material layer 1648*a*/metal gate material layer 1646/dielectric material layer 1644 to form silicon layer 1652*a*/silicon layer 1648*a*/metal gate layer 1646*a*/dielectric layer 1644*a*, respectively. To define the PFET gate stack, an etch is performed through silicon material layer 1652/silicon material layer 1648/metal gate material layer 1646/dielectric material layer 1644 to form silicon layer 1652*b*/silicon layer 1648*b*/metal gate layer 1646*b*/dielectric layer 1644*b*, respectively.

One or more dopants may be introduced into the silicon layers (as described above), i.e., by any suitable implantation process, prior to silicidation (see below). By way of example only, an n-type dopant can be introduced into silicon layer 1652*a*/silicon layer 1648*a* and a p-type dopant can be introduced into silicon layer 1652*b*/silicon layer 1648*b*. As described above, however, a dopant is not needed for those gate stacks that will be fully silicided (see, for example, step 1616, below).

The NFET and PFET gate stacks, defined in step 1612 above, are then either partially or fully sillicided, as in steps 1614 or 1616, respectively. Namely, in step 1614, a first silicide metal layer comprising, e.g., one or more of Ni and Co (as described above), is deposited over the NFET gate stack and a second silicide metal layer comprising, e.g., one or more of Ni and Co (as described above), is deposited over the PFET gate stack. According to an exemplary embodiment, the first silicide metal layer and the second silicide metal layer have the same composition as each other. Alternatively, the first silicide metal layer can have a composition that is different from a composition of the second silicide metal layer. In that instance, a sequence of annealing steps (described below) would be performed. By way of example only, the silicide that is formed at a higher annealing temperature (e.g., cobalt silicide $CoSi_2$) would be formed first, followed by the silicide that is formed at a lower annealing temperature (e.g., nickel silicide $NiSi_2$).

A thickness of the first silicide metal layer is configured such that, upon annealing (described below), a silicide is formed that completely consumes silicon layer 1652*a* and a portion of silicon layer 1648*a*, so as to transcend the interface, i.e., interface 1658, between silicon layer 1652*a* and silicon layer 1648*a*. Similarly, a thickness of the second silicide metal layer is configured such that, upon annealing (described below), a silicide is formed that completely consumes silicon layer 1652*b* and a portion of silicon layer 1648*b*, so as to transcend the interface, i.e., interface 1660, between silicon layer 1652*b* and silicon layer 1648*b*. As described above, silicidation past the interface of the silicon layers in the gate stack eliminates the interface issues.

The NFET and PFET gate stacks are then annealed to form silicide regions 1662 and 1664, respectively. According to an exemplary embodiment, the NFET and PFET gate stacks are annealed at a temperature of between about 400 degrees ° C. and about 600° C. As such, partially silicided NFET and PFET gates stacks are formed.

Alternatively, in step 1616, a first silicide metal layer comprising, e.g., one or more of Ni and Co (as described above), is deposited over the NFET gate stack and a second silicide metal layer comprising, e.g., one or more of Ni and Co (as described above), is deposited over the PFET gate stack. A thickness of the first silicide metal layer is configured such that, upon annealing (described below), a silicide is formed that completely consumes both silicon layer 1652*a* and silicon layer 1648*a*, transcending the interface, i.e., interface 1658, between silicon layer 1652*a* and silicon layer 1648*a*. Similarly, a thickness of the second silicide metal layer is configured such that, upon annealing (described below), a silicide is formed that completely consumes silicon layer 1652*b* and silicon layer 1648*b*, transcending the interface, i.e., interface 1660, between silicon layer 1652*b* and silicon layer 1648*b*. As described above, silicidation past the interface of the silicon layers in the gate stack eliminates the interface issues.

The NFET and PFET gate stacks are then annealed to form silicide regions 1666 and 1668, respectively. According to an exemplary embodiment, the NFET and PFET gate stacks are annealed at a temperature of between about 400° C. and about 600° C. As such, fully silicided NFET and PFET gates stacks are formed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A metal-oxide semiconductor device comprising:
   a substrate; and
   at least one NFET having a gate stack over the substrate, the NFET gate stack comprising:
   an NFET gate stack metal gate layer;
   a first NFET gate stack silicon layer over the NFET gate stack metal gate layer;
   a second NFET gate stack silicon layer over a side of the first NFET gate stack silicon layer opposite the NFET gate stack metal gate layer, wherein an interface is defined between the first NFET gate stack silicon layer and the second NFET gate stack silicon layer; and
   an NFET gate stack silicide region that extends through the interface between the first NFET gate stack silicon layer and the second NFET gate stack silicon layer.

2. The device of claim 1, further comprising:
   at least one PFET having a gate stack over the substrate, the PFET gate stack comprising:
   a first PFET gate stack silicon layer;
   a second PFET gate stack silicon layer over a side of the first PFET gate stack silicon layer, wherein an interface is defined between the first PFET gate stack silicon layer and the second PFET gate stack silicon layer; and a PFET gate stack silicide region that extends through the interface between the first PFET gate stack silicon layer and the second PFET gate stack silicon layer.

3. The device of claim 1, further comprising:

at least one PFET having a gate stack over the substrate, the PFET gate stack comprising:

a PFET gate stack metal gate layer;

a first PFET gate stack silicon layer over the PFET gate stack metal gate layer;

a second PFET gate stack silicon layer over a side of the first PFET gate stack silicon layer opposite the PFET gate stack metal gate layer, wherein an interface is defined between the first PFET gate stack silicon layer and the second PFET gate stack silicon layer; and a PFET gate stack silicide region that extends through the interface between the first PFET gate stack silicon layer and the second PFET gate stack silicon layer.

4. The device of claim 1, further comprising an NFET gate stack dielectric layer between the NFET gate stack metal gate layer and the substrate.

5. The device of claim 4, wherein the NFET gate stack dielectric layer comprises a high-k dielectric material.

6. The device of claim 2, further comprising a PFET gate stack dielectric layer between the first PFET gate stack silicon layer and the substrate.

7. The device of claim 6, wherein the PFET gate stack dielectric layer comprises one or more of an oxynitride and silicon oxynitride.

8. The device of claim 1, wherein the NFET gate stack silicide region entirely consumes the first NFET gate stack silicon layer and a portion of the second NFET gate stack silicon layer.

9. The device of claim 1, wherein the NFET gate stack silicide region entirely consumes the first NFET gate stack silicon layer and the second NFET gate stack silicon layer.

10. The device of claim 2, wherein the PFET gate stack silicide region entirely consumes the first PFET gate stack silicon layer and a portion of the second PFET gate stack silicon layer.

11. The device of claim 2, wherein the PFET gate stack silicide region entirely consumes the first PFET gate stack silicon layer and the second PFET gate stack silicon layer.

12. The device of claim 1, wherein the first NFET gate stack silicon layer has a thickness of up to about 20 nanometers.

13. The device of claim 1, wherein the second NFET gate stack silicon layer has a thickness of between about 50 nanometers and about 80 nanometers.

14. The device of claim 1, wherein the NFET gate stack metal gate layer comprises one or more of tantalum, tantalum nitride, tantalum carbide nitride, tantalum silicon nitride, tantalum silicide, aluminum nitride, tungsten and molybdenum.

15. The device of claim 2, wherein the substrate further comprises at least one shallow trench isolation region between the NFET and the PFET.

16. The device of claim 1, further comprising at least one NFET having a gate stack over the substrate, the NFET gate stack comprising:

a first NFET gate stack silicon layer;

a second NFET gate stack silicon layer over the first NFET gate stack silicon layer, wherein an interface is defined between the first NFET gate stack silicon layer and the second NFET gate stack silicon layer; and an NFET gate stack silicide region that extends through the interface between the first NFET gate stack silicon layer and the second NFET gate stack silicon layer.

17. A metal-oxide semiconductor device comprising:

a substrate;

at least one NFET having a gate stack over the substrate, the NFET gate stack comprising:

a first NFET gate stack silicon layer;

a second NFET gate stack silicon layer over the first NFET gate stack silicon layer, wherein an interface is defined between the first NFET gate stack silicon layer and the second NFET gate stack silicon layer;

an NFET gate stack silicide region that extends through the interface between the first NFET gate stack silicon layer and the second NFET gate stack silicon layer; and at least one PFET having a gate stack over the substrate, the PFET gate stack comprising:

a PFET gate stack metal gate layer;

a first PFET gate stack silicon layer over the PFET gate stack metal gate layer;

a second PFET gate stack silicon layer over a side of the first PFET gate stack silicon layer opposite the PFET gate stack metal gate layer, wherein an interface is defined between the first PFET gate stack silicon layer and the second PFET gate stack silicon layer; and a PFET gate stack silicide region that extends through the interface between the first PFET gate stack silicon layer and the second PFET gate stack silicon layer.

* * * * *